(12) United States Patent
Wang et al.

(10) Patent No.: US 12,189,249 B2
(45) Date of Patent: Jan. 7, 2025

(54) DISPLAY SUBSTRATE AND DISPLAY APPARATUS

(71) Applicants: Beijing BOE Optoelectronics Technology Co., Ltd., Beijing (CN); BOE Technology Group Co., Ltd., Beijing (CN)

(72) Inventors: Xian Wang, Beijing (CN); Yu Zhao, Beijing (CN); Xiaojuan Wu, Beijing (CN); Chunnan Feng, Beijing (CN); Jian Wang, Beijing (CN); Yong Zhang, Beijing (CN); Dawei Feng, Beijing (CN); Hailong Wang, Beijing (CN); Huairui Yue, Beijing (CN); Yang Ge, Beijing (CN); Jianwei Ma, Beijing (CN); Lei Shi, Beijing (CN); Feng Qu, Beijing (CN); Biqi Li, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/777,737

(22) PCT Filed: Jun. 24, 2021

(86) PCT No.: PCT/CN2021/102064
§ 371 (c)(1),
(2) Date: May 18, 2022

(87) PCT Pub. No.: WO2022/266930
PCT Pub. Date: Dec. 29, 2022

(65) Prior Publication Data
US 2024/0210773 A1 Jun. 27, 2024

(51) Int. Cl.
*G02F 1/1362* (2006.01)
*G02F 1/1335* (2006.01)
(Continued)

(52) U.S. Cl.
CPC ...... *G02F 1/136286* (2013.01); *G02F 1/1368* (2013.01); *H01L 27/124* (2013.01); *G02F 1/133555* (2013.01); *G02F 1/134309* (2013.01)

(58) Field of Classification Search
CPC . G02F 1/136286; G02F 1/1368; H01L 27/124
See application file for complete search history.

(56) References Cited

U.S. PATENT DOCUMENTS

| | | | | |
|---|---|---|---|---|
| 2003/0043098 A1* | 3/2003 | Aoyama | ............... | G09G 3/3648 345/87 |
| 2006/0146243 A1* | 7/2006 | Nakanishi | ......... | G02F 1/133711 349/139 |

(Continued)

FOREIGN PATENT DOCUMENTS

| | | |
|---|---|---|
| CN | 102749770 A | 10/2012 |
| CN | 105094231 A | 11/2015 |

(Continued)

OTHER PUBLICATIONS

Search Report dated Nov. 22, 2023 issued in corresponding European Application No. 21946426.0.

*Primary Examiner* — Lucy P Chien
(74) *Attorney, Agent, or Firm* — Nath, Goldberg & Meyer; Joshua B. Goldberg

(57) ABSTRACT

There is provided a display substrate having a display region, and a peripheral region surrounding the display region, and including: a base substrate; first conductive structures in the display region and the peripheral region; the first conductive structures each extend in a first direction and are arranged side by side in a second direction; an interlayer insulation layer on a side of the first conductive structures (Continued)

away from the base substrate; second conductive structures on a side of the interlayer insulation layer away from the base substrate; the second conductive structures each extend in the second direction and are arranged side by side in the first direction; the second conductive structures intersect with the first conductive structures, and are electrically connected with the first conductive structures through vias in the interlayer insulation layer; and at least one third conductive structure in the display region. A display apparatus is provided.

16 Claims, 15 Drawing Sheets

(51) Int. Cl.
  *G02F 1/1343* (2006.01)
  *G02F 1/1368* (2006.01)
  *H01L 27/12* (2006.01)

(56) References Cited

U.S. PATENT DOCUMENTS

| | | |
|---|---|---|
| 2016/0365364 A1 | 12/2016 | Li et al. |
| 2019/0067403 A1 | 2/2019 | Song et al. |
| 2019/0207426 A1 | 7/2019 | Morita |

FOREIGN PATENT DOCUMENTS

| | | |
|---|---|---|
| CN | 105446526 A | 3/2016 |
| CN | 206163493 U | 5/2017 |
| CN | 110993626 A | 4/2020 |
| CN | 111258459 A | 6/2020 |
| CN | 111430370 A | 7/2020 |
| CN | 111430443 A | 7/2020 |
| CN | 111525232 A | 8/2020 |
| CN | 212033026 U | 11/2020 |
| CN | 112462560 A | 3/2021 |
| WO | 2015146298 A1 | 10/2015 |

* cited by examiner

DISPLAY SUBSTRATE AND DISPLAY APPARATUS

This is a National Phase Application filed under 35 U.S.C. 371 as a national stage of PCT/CN2021/102064, filed Jun. 24, 2021, the contents of which is hereby incorporated by reference in its entirety.

TECHNICAL FIELD

The present disclosure relates to the field of display technology, and specifically relates to a display substrate and a display apparatus.

BACKGROUND

Near Field Communication (NFC) technology is a non-contact identification and interconnection technology that adopts a near field magnetic field communication mode, which has the characteristics of short transmission distance, low energy consumption, resistance to signal interference and the like, and can achieve near field wireless communication between mobile devices and consumer electronic products.

The near field communication technology has been generally applied to electronic devices for data exchange, and in order to utilize the near field communication technology, a communication antenna is to be installed on an electronic device to transmit and receive electromagnetic wave signals, but the communication antenna will occupy a relatively large space. Current electronic devices mostly utilize the NFC technology by providing an independent NFC module external to a motherboard of each of the electronic devices, and thus each occupy a relatively large space, which is unfavorable for a lightweight design of the electronic device.

SUMMARY

To solve at least one of the technical problems in the existing art, the present disclosure provides a display substrate and a display apparatus.

In a first aspect, an embodiment of the present disclosure provides a display substrate, having a display region, and a peripheral region surrounding the display region; the display substrate includes:
  a base substrate;
  a plurality of first conductive structures on the base substrate in the display region and the peripheral region; where the plurality of first conductive structures each extend in a first direction and are arranged side by side in a second direction;
  an interlayer insulation layer on a side of the first conductive structures away from the base substrate;
  a plurality of second conductive structures on a side of the interlayer insulation layer away from the base substrate and in the display region and the peripheral region; where the plurality of second conductive structures each extend in the second direction and are arranged side by side in the first direction; and the second conductive structures intersect with the first conductive structures, and are electrically connected with the first conductive structures through vias penetrating through the interlayer insulation layer; and
  at least one third conductive structure on the base substrate in at least the display region; where the third conductive structure includes a plurality of first conductive lines and a plurality of second conductive lines; each first conductive line forms at least a partial structure of one of the first conductive structures, and part of the first conductive structures each include two first conductive lines; and each second conductive line forms at least a partial structure of one of the second conductive structures.

In some implementations, the display substrate further includes:
  a plurality of gate lines on the base substrate in the display region and the peripheral region; where the plurality of gate lines each extend in the first direction and are arranged side by side in the second direction; and
  a plurality of data lines on the base substrate in the display region and the peripheral region; where the plurality of gate lines each extend in the second direction and are arranged side by side in the first direction; and
  a plurality of sub-pixels on the base substrate in the display region; where the sub-pixels are disposed in regions defined by the gate lines and data lines, with the gate lines intersecting with the data lines; the sub-pixels arranged side by side in the first direction form first pixel groups; the sub-pixels arranged side by side in the second direction form second pixel groups; and any adjacent first pixel groups are provided with one of the first conductive structures therebetween.

In some implementations, at least part pairs of adjacent second pixel groups each are provided with one of the second conductive structures between the adjacent second pixel groups.

In some implementations, the sub-pixels in a same one of the second pixel groups have a same color, and every N sub-pixels arranged side by side in the first direction form a pixel unit, where N≥2; and N is an integer; the pixel units arranged side by side in the second direction form a pixel unit group; and each pixel unit group is provided with at least one second conductive structure.

In some implementations, the N sub-pixels in the pixel unit include a red sub-pixel, a green sub-pixel, and a blue sub-pixel; the second conductive structure is located between the red sub-pixel and the green sub-pixel.

In some implementations, the display substrate includes at least one first region and at least one second region; each first region is provided with one third conductive structure; and
  the display substrate further includes:
  a plurality of third conductive lines and a plurality of fourth conductive lines on the base substrate in the second region and the peripheral region; where the plurality of third conductive lines intersect with the plurality of fourth conductive lines, and each third conductive line forms at least a partial structure of one of the first conductive structures, and each fourth conductive line is a partial structure of one of the second conductive structures; and a distance between the fourth conductive line and the second conductive line in a same one of the second conductive structures ranges from 2 μm to 6 μm.

In some implementations, the display substrate further includes:
  a common electrode line on the base substrate in the peripheral region; where the common electrode line includes a first common electrode sub-line extending in the first direction, and a second common electrode sub-line extending in the second direction; the first common electrode sub-line is disposed in a same layer and made of a same material as the first conductive structures; the second common electrode sub-line is disposed in a same layer and made of a same material as the second conductive structures; the first common electrode sub-line is electrically connected to the second common electrode sub-line through a via penetrating through the interlayer insulation layer;

each third conductive line is electrically connected to the second common electrode sub-line through a via penetrating through the interlayer insulation layer; and/or each fourth conductive line is electrically connected to the first common electrode sub-line through a via penetrating through the interlayer insulation layer.

In some implementations, the third conductive structure includes at least one coil part; the coil part includes at least two sub-structures extending in different directions; and each of the sub-structures includes the first conductive line and the second conductive line.

In some implementations, the coil part includes three sub-structures, including two first sub-structures and one second sub-structure; and the two first sub-structures each extend in the second direction, and are arranged side by side in the first direction, and the second sub-structure is connected between the two first sub-structures.

In some implementations, the display region includes at least one first region and at least one second region; the third conductive structure is located in the first region; the first region includes a non-functional region, and a functional region surrounding the non-functional region; the coil part is disposed in the functional region;

the display substrate further includes: a plurality of fifth conductive lines and a plurality of sixth conductive lines in the non-functional region; the fifth conductive lines intersect with the sixth conductive lines, and each first conductive structure includes the fifth conductive line; each second conductive structure includes the sixth conductive line; a distance between the fifth conductive line and the first conductive line in a same one of the first conductive structures ranges from 2 µm to 6 µm; and/or a distance between the sixth conductive line and the second conductive line in a same one of the second conductive structures ranges from 2 µm to 6 µm.

In some implementations, each fifth conductive line includes a plurality of first conductive sub-lines arranged side by side and at intervals in the first direction; a gap between adjacent first conductive sub-lines is located between adjacent sub-pixels.

In some implementations, the gap between adjacent first conductive sub-lines has a width ranging from 2 µm to 6 µm.

In some implementations, the display substrate further includes:
a common electrode line on the base substrate in the peripheral region; where the common electrode line includes a first common electrode sub-line extending in the first direction, and a second common electrode sub-line extending in the second direction; the first common electrode sub-line is disposed in a same layer and made of a same material as the first conductive structures; the second common electrode sub-line is disposed in a same layer and made of a same material as the second conductive structures; the first common electrode sub-line is electrically connected to the second common electrode sub-line through a via penetrating through the interlayer insulation layer; and each sixth conductive line is electrically connected to the first common electrode sub-line through a via penetrating through the interlayer insulation layer.

In some implementations, the display region includes at least one first region and at least one second region; the third conductive structure is located in the first region; the first region includes a non-functional region, and a functional region surrounding the non-functional region; the functional region includes functional sub-regions which are nested, and a redundant functional region between adjacent functional sub-regions; each functional sub-region is provided with one coil part;

the display substrate further includes a redundant coil part on the base substrate; and each redundant functional region is provided with one redundant coil part; and the redundant coil part includes a plurality of seventh conductive lines and a plurality of eighth conductive lines in the redundant functional region; where the seventh conductive lines intersect with the eighth conductive lines, and each seventh conductive line is a partial structure of one of the first conductive structures, and each eighth conductive line is a partial structure of one of the second conductive structures.

In some implementations, a distance between the first conductive line and the seventh conductive line closest the first conductive line in a same one of the first conductive structures ranges from 2 µm to 6 µm; and/or a distance between the eighth conductive line and the closest second conductive line closest thereto the eighth conductive line in a same one of the second conductive structures ranges from 2 µm to 6 µm.

In some implementations, the redundant coil part includes two first redundant sub-structures arranged side by side in the first direction and each extending in the second direction, and a second redundant sub-structure extending in the first direction and connected between the two first redundant sub-structures; the first redundant sub-structures and the second redundant sub-structure each include the seventh conductive line and the eighth conductive line; the eighth conductive line in each first redundant structure extends to a region where the second redundant structure is located, and the seventh conductive line in the second redundant structure extends to a region where each first redundant structure is located:

each seventh conductive line in the first redundant sub-structure includes a plurality of second conductive sub-lines arranged side by side in the first direction; a gap between adjacent second conductive sub-lines is located between adjacent sub-pixels; and/or each eighth conductive line in the second redundant sub-structure includes a plurality of third conductive sub-lines arranged side by side in the second direction; and a gap between adjacent third conductive sub-lines is located between adjacent sub-pixels.

In some implementations, the gap between adjacent second conductive sub-lines has a width ranging from 2 µm to 6 µm; and/or, the gap between adjacent third conductive sub-lines has a width ranging from 2 µm to 6 µm.

In some implementations, the display substrate further includes:
a common electrode line which includes a first common electrode sub-line extending in the first direction, and a second common electrode sub-line extending in the second direction; where the first common electrode sub-line is disposed in a same layer and made of a same material as the first conductive structures; the second common electrode sub-line is disposed in a same layer and made of a same material as the second conductive structures; the first common electrode sub-line is electrically connected to the second common electrode sub-line through a via penetrating through the interlayer insulation layer;

each eighth conductive line of the first redundant sub-structure is electrically connected to the first common electrode sub-line through a via penetrating through the interlayer insulation layer; and/or each seventh conductive line of the second redundant sub-structure is electrically connected to the second common electrode sub-line through a via penetrating through the interlayer insulation layer.

In some implementations, the display substrate further includes a connection jumper on the base substrate, where the connection jumper is connected to the coil part to form a spiral coil.

In some implementations, the display substrate further includes a flexible circuit board on which a connection jumper is disposed, and the connection jumper is connected to the coil part to form a spiral coil.

In some implementations, two coil parts, including a first coil part and a second coil part, are provided, and the first coil part surrounds the second coil part; the first coil part and the second coil part each include a first end and a second end, and two ends of the connection jumper are connected to the first end of the first coil part and the second end of the second coil part, respectively.

In some implementations, the second end of the first coil part is connected to a first extraction electrode; the first end of the second coil part is connected to a second extraction electrode; the first extraction electrode and/or the second extraction electrode include a first extraction part and a second extraction part which are disposed on the base substrate and electrically connected through a via penetrating through the interlayer insulation layer; and the first extraction part is disposed in a same layer and made of a same material as the first sub-structures, and the second extraction part is disposed in a same layer and made of a same material as the second sub-structure.

In some implementations, the display substrate further includes: a first conductive layer on the base substrate; where the first conductive layer includes the first conductive structure and the gate line; and a second conductive layer on a side of the interlayer insulation layer away from the base substrate; where the second conductive layer includes the second conductive structure and the data line.

In some implementations, each first conductive structure includes a first body part and a first connection part; the first body part extends in the first direction, and the first connection part is connected to the first body part; each second conductive structure includes a second body part and a second connection part; the second body part extends in the second direction, and the second connection part is connected to the second body part; and the first connection part of each first conductive structure is connected to the second connection part of the second conductive structure intersected with the first conductive structure through a via penetrating through the interlayer insulation layer.

In some implementations, the first connection part is located between the first body part connected thereto and the gate line closest to the first body part; the second connection part is located on a side of the second body part connected thereto away from the data line closest to the second body part; and the first connection part and the second connection part each include a first side edge and a second side edge disposed oppositely in the first direction, and a third side edge and a fourth side edge disposed oppositely in the second direction; where the third side edge of the first connection part is connected to the first body part; the second side edge of the second connection part is connected to the second body part;

orthographic projections of the first side edge and the third side edge of the first connection part on the base substrate has a distance not less than 2.0 µm to an orthographic projection of the via on the base substrate; and/or orthographic projections of the first side edge, the third side edge, and the fourth side edge of the second connection part on the base substrate has a distance not less than 2.0 µm to the orthographic projection of the via on the base substrate.

In some implementations, a distance between the first connection part and the gate line closest thereto is not less than 4 µm.

In some implementations, a distance between the second body part and the data line closest thereto is not less than 3.5 µm.

In some implementations, each sub-pixel includes at least a thin film transistor, a pixel electrode, and a common electrode; a gate of the thin film transistor is disposed in a same layer and made of a same material as the gate lines, and a source and a drain of the thin film transistor is disposed in a same layer and made of a same material as the data lines; the pixel electrode is connected to the drain of the thin film transistor, the common electrode is disposed on a side of the pixel electrode away from the base substrate, and a passivation layer is disposed between a layer where the common electrode is located and a layer where the pixel electrode is located; and a distance between the second connection part and the pixel electrode closest thereto is not less than 2.0 µm.

In some implementations, each sub-pixel includes at least a thin film transistor, a pixel electrode, and a common electrode; a gate of the thin film transistor is disposed in a same layer and made of a same material as the gate lines, and a source and a drain of the thin film transistor is disposed in a same layer and made of a same material as the data lines; the pixel electrode is connected to the drain of the thin film transistor, the common electrode is disposed on a side of the pixel electrode away from the base substrate, and a passivation layer is disposed between a layer where the common electrode is located and a layer where the pixel electrode is located; and common electrodes in the sub-pixels are connected into one piece to form a common electrode layer; and the common electrode layer includes a plurality of first openings each extending in the second direction and arranged side by side in the first direction; and an orthographic projection of each first opening on the base substrate partially overlaps an orthographic projection of one of the second conductive structures on the base substrate.

In some implementations, the common electrode is a slit electrode; and orthographic projections of the first conductive structures and the common electrode on the base substrate at least partially overlap.

In some implementations, the common electrode layer further includes a plurality of second openings each extending in the first direction and arranged side by side in the second direction; and an orthographic projection of each second opening on the base substrate at least partially overlaps orthogonal projections of a plurality of thin film transistors arranged side by side in the first direction on the base substrate.

In some implementations, the peripheral region includes a first pad region and a second pad region on opposite sides of the display region along the second direction; and the third conductive structure is disposed on a side of the display region close to the first pad region and/or the second pad region.

In some implementations, the third conductive structure includes a near field communication antenna.

In a second aspect, an embodiment of the present disclosure provides a display apparatus including the display substrate as described above.

In some implementations, the display apparatus further includes an opposite substrate on which a black matrix is provided, the opposite substrate and the display substrate are aligned and assembled into a cell, and an orthographic projection of the third conductive structure on the base substrate is located within an orthogonal projection range of the black matrix on the base substrate.

DETAIL DESCRIPTION OF EMBODIMENTS

To facilitate understanding of the technical solution of the present disclosure for those skilled in the art, the present disclosure will be described below in detail with the help of accompanying drawings and specific implementations.

Unless otherwise defined, technical or scientific terms used in the present disclosure are intended to have general meanings as understood by those of ordinary skill in the art. The words "first", "second" and similar terms used in the present disclosure do not denote any order, quantity, or importance, but are used merely for distinguishing different components. Also, the use of the terms "a", "an", or "the" and similar referents do not denote a limitation of quantity, but rather denote the presence of at least one. The word "comprising" or "including" or the like means that the element or item preceding the word contains elements or items that appear after the word or equivalents thereof, but does not exclude other elements or items. The terms "connected" or "coupled" and the like are not restricted to physical or mechanical connections, but may include electrical connections, whether direct or indirect. The words "upper/on". "lower/below", "left", "right", or the like are merely used to indicate a relative positional relationship, and when an absolute position of the described object is changed, the relative positional relationship may be changed accordingly.

It should be noted that embodiments of the present disclosure provide a display substrate and a display apparatus. The display apparatus may be a liquid crystal display apparatus, or may be an organic electroluminescent diode (OLED) display apparatus. Certainly, other types of display apparatuses are also possible, and are not listed one by one here. In the embodiments of the present disclosure, the description is made by taking the display apparatus being a liquid crystal display apparatus as an example. The liquid crystal display apparatus includes a display substrate and an opposite substrate, which are disposed oppositely and aligned and assembled into a cell, and a liquid crystal layer disposed between the display substrate and the opposite substrate. The display substrate used herein may be an array substrate, or may be a color on array (COA) substrate. When the display substrate is an array substrate, the opposite substrate includes a color filter layer. When the display substrate is a COA substrate, no color filter layer is provided on the opposite substrate. In the embodiments of the present disclosure, the illustration is made by taking the display substrate being an array substrate as an example.

Figure 1:
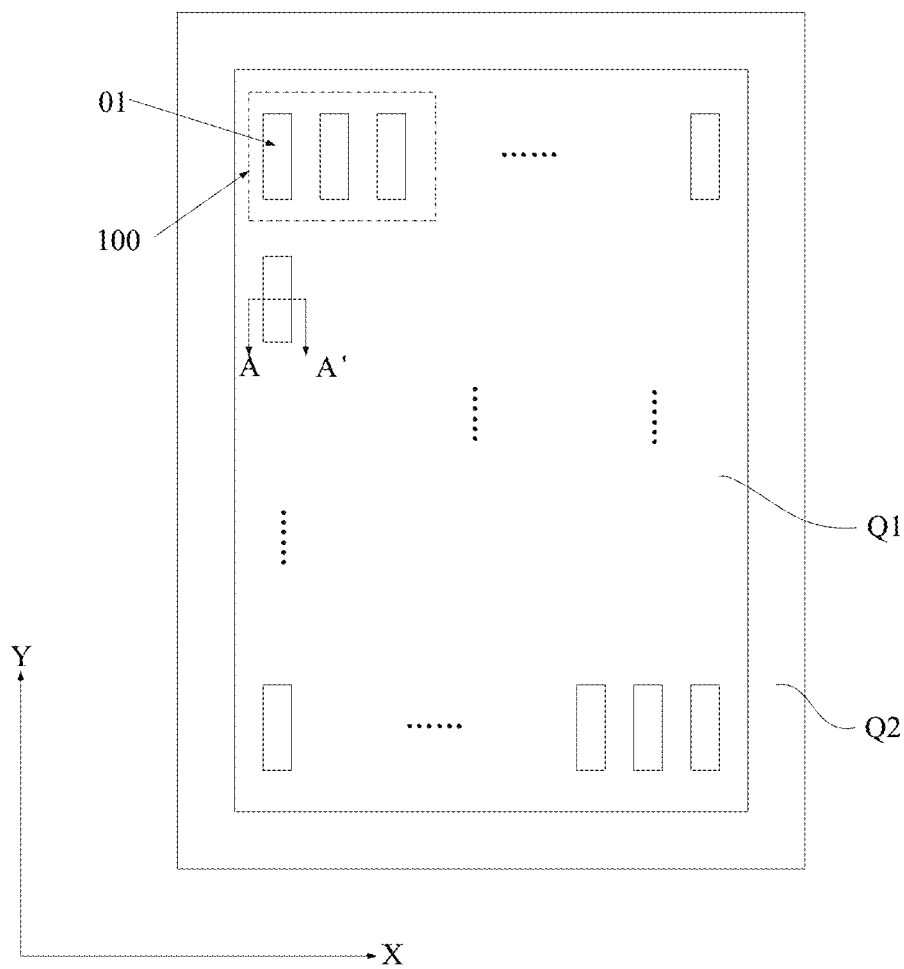
FIG. 1 is a schematic diagram of an exemplary display substrate.
Figure 2:
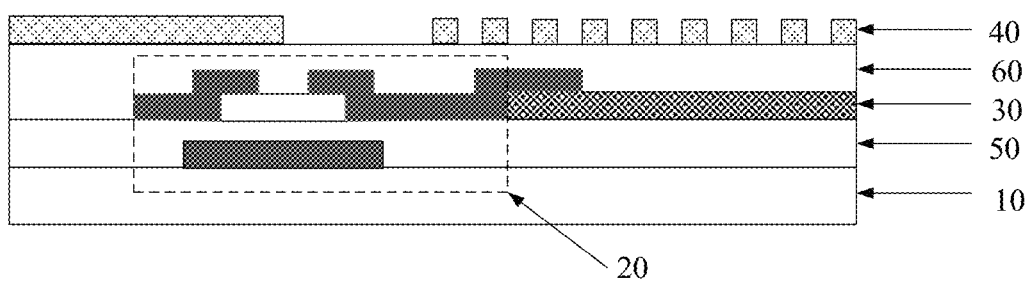
FIG. 2 is a cross-sectional view taken along A-A' of the display substrate shown in FIG. 1.

FIG. 1 is a schematic diagram of an exemplary display substrate. As shown in FIG. 1, the display substrate has a display region Q1, and a peripheral region Q2 surrounding the display region Q1. The peripheral region Q2 includes a first pad region Q21 at a side of the display region Q1. The display substrate includes a base substrate 10, a plurality of gate lines GL and a plurality of data lines DL on the base substrate 10, and a plurality of sub-pixels defined by the gate lines GL and the data lines DL, with the gate lines GL intersecting with the data lines DL. The plurality of gate lines GL each extend in a first direction X and are arranged side by side in a second direction Y: the plurality of data lines DL each extend in the second direction Y and are arranged side by side in the first direction X: the sub-pixels 01 arranged side by side in the first direction X form a first pixel group; and the sub-pixels 01 arranged side by side in the second direction Y form a second pixel group. Each sub-pixel includes at least a thin film transistor 20, a pixel electrode 30, and a common electrode 40. Gates of thin film transistors 20 in the sub-pixels 01 of a same first pixel group are connected to a same one of the gate lines GL; and sources of thin film transistors 20 in the sub-pixels of a same second pixel group are connected to a same one of the data lines DL. FIG. 2 is a cross-sectional view taken along A-A' of the display substrate shown in FIG. 1. As shown in FIG. 2, the thin film transistor 20 in each sub-pixel 01 includes a gate, an active layer, a source, and a drain which are sequentially arranged in a direction away from the base substrate 10. The drain of the thin film transistor 20 is connected to the pixel electrode 30. An interlayer insulation layer 50 (serving as a gate insulation layer) is disposed between the gate and the active layer, and the pixel electrode 30 is located on a side of the interlayer insulation layer 50 away from the base substrate 10. A passivation layer 60 covers the source and the drain of the thin film transistor 20 and a side of the pixel electrode 30 away from the base substrate 10, and the common electrode 40 is formed on a side of the passivation layer 60 away from the base substrate 10. The pixel electrode 30 is a plate electrode, and the common electrode 40 is a slit electrode.

It should be noted that, in the embodiments of the present disclosure, the first direction X and the second direction Y do not refer to a direction extending straight, but an extending direction or length direction of a certain structure. FIG. 2 merely shows an example where the thin film transistor 20 is a bottom gate thin film transistor, which does not form any limitation to the scope of the embodiments of the present disclosure. The thin film transistor 20 may also be a top gate thin film transistor. In addition, in the embodiments of the present disclosure, each sub-pixel includes the pixel electrode 30 and the common electrode 40, and in some examples, the common electrode 40 may be disposed on a color filter substrate, such as in a TN mode display apparatus. Therefore, the common electrode 40 on the display substrate does not form any limitation to the scope of the embodiments of the present disclosure, either. In the embodiments of the present disclosure, the illustration is made merely by taking a case where the pixel electrode 30 and the common electrode 40 are both disposed on the display substrate as an example.

In addition, the display substrate includes a plurality of pixel units 100 arranged in an array, each pixel unit 100 including N sub-pixels, where N≥2, and N is an integer. In the embodiments of the present disclosure, a case where three sub-pixels are included in one pixel unit, that is, N=3, is taken as an example. For example, each pixel unit includes a red sub-pixel, a green sub-pixel, and a blue sub-pixel. In this case, sub-pixels in a same column may emit light of a same color.

For the above display substrate, in the embodiments of the present disclosure, by integrating a third conductive structure therein, additional functions other than display, such as signal transceiving, and the like, are implemented. The following description is made by taking the third conductive structure being a coil part 70 in the near field communication antenna as an example, which does not form any limitation to the scope of the embodiments of the present disclosure.

Figure 3:
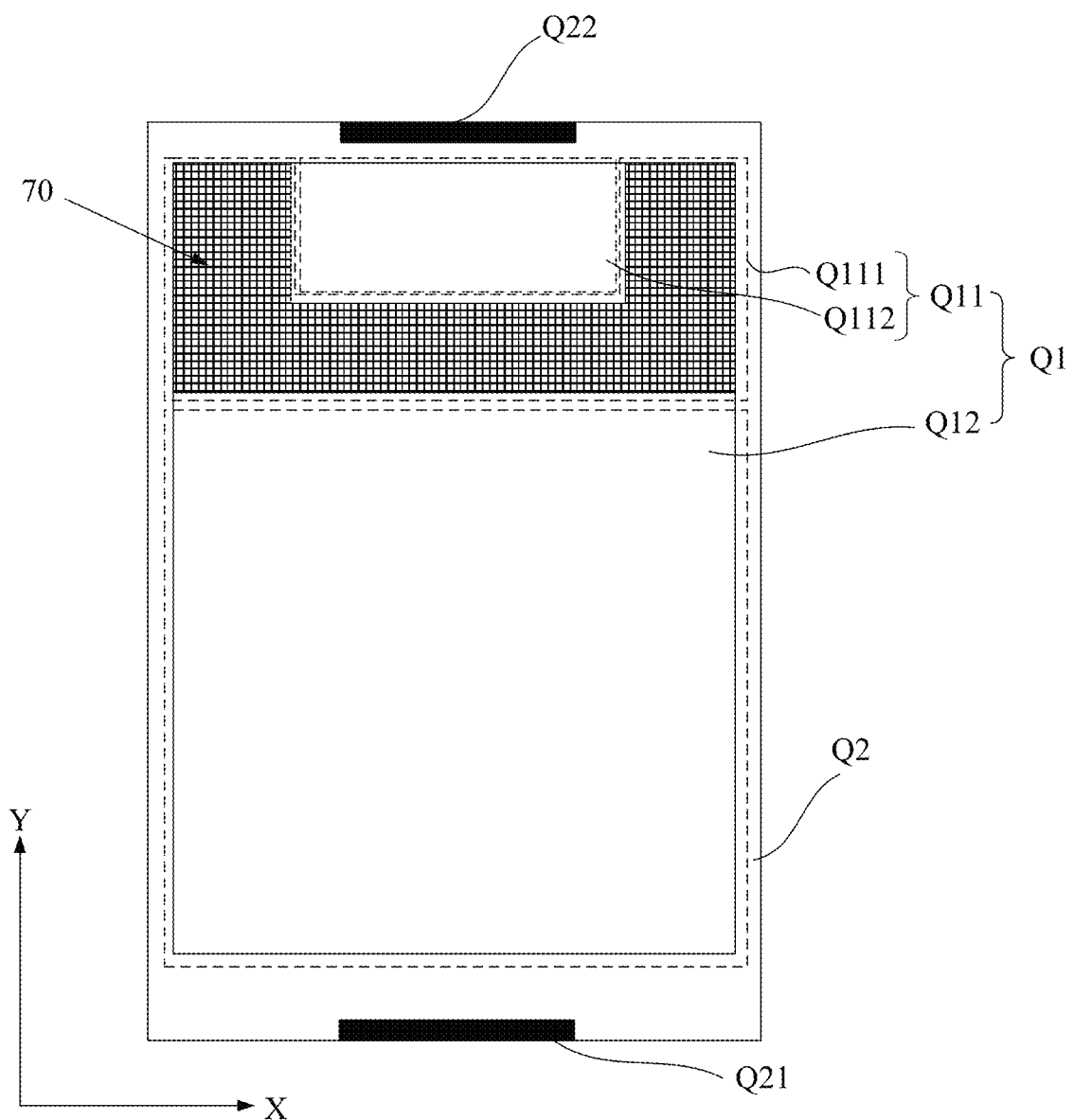
FIG. 3 is a schematic diagram of a display substrate according to an embodiment of the present disclosure.
Figure 4:
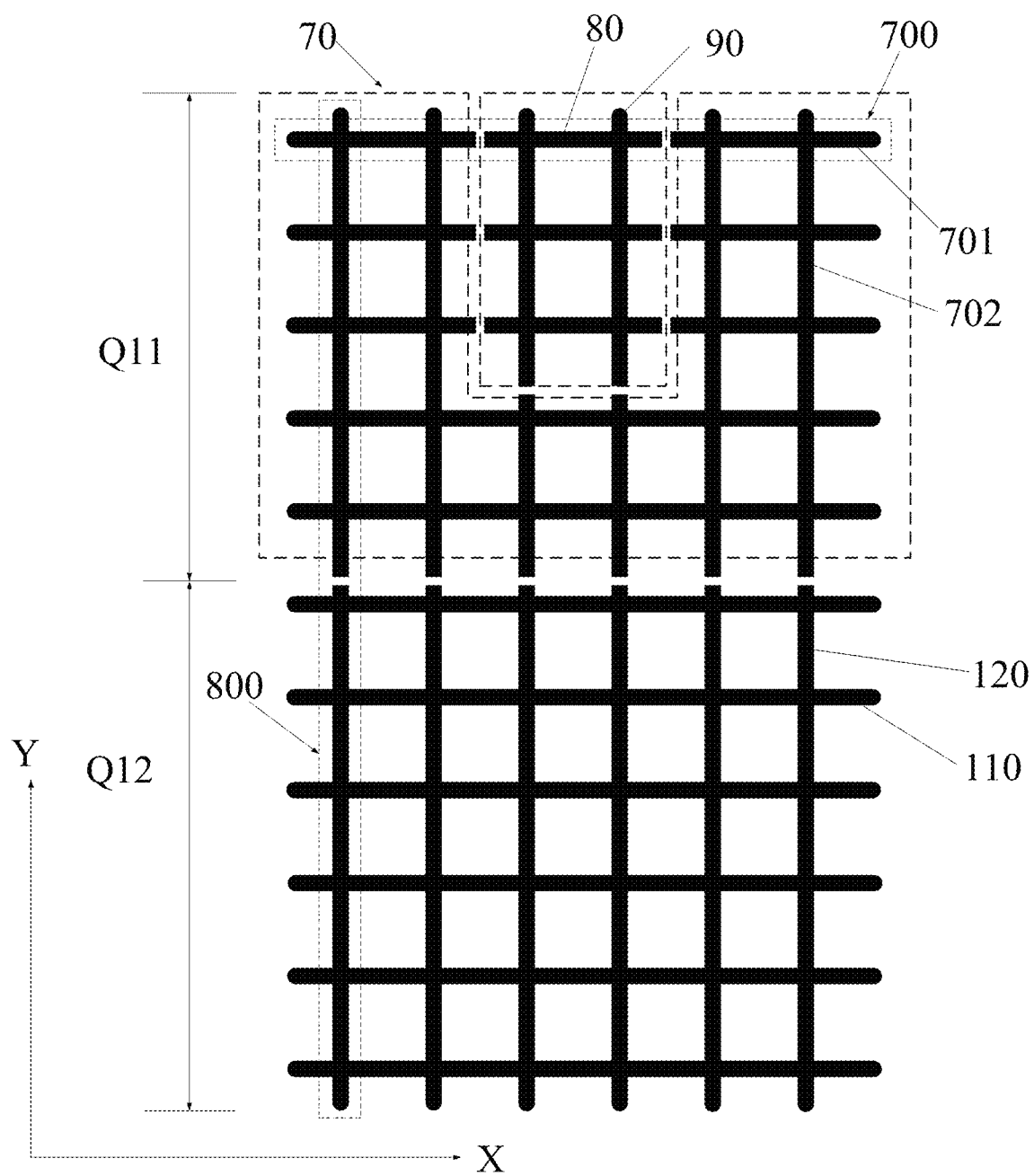
FIG. 4 is a schematic partial structure diagram of a display substrate according to an embodiment of the present disclosure.

In a first aspect, FIG. 3 is a schematic diagram of a display substrate according to an embodiment of the present disclosure; and FIG. 4 is a schematic partial structure diagram of a display substrate according to an embodiment of the present disclosure. As shown in FIGS. 3 and 4, the display substrate has a display region Q1, and a peripheral region Q2 surrounding the display region Q1. The display substrate includes: a base substrate 10, a plurality of first conductive structures 700, a plurality of second conductive structures 800, an interlayer insulation layer 50, and at least one near field communication antenna. The first conductive structures 700 are all disposed on the base substrate 10, and located in the display region Q1 and the peripheral region Q2. The first conductive structures 700 each extend in a first direction X and are arranged side by side in a second direction Y. The interlayer insulation layer 50 is disposed on a side of the first conductive structures 700 away from the base substrate 10. The second conductive structures 800 are disposed on a side of the interlayer insulation layer 50 away from the base substrate 10, and located in the display region Q1 and the peripheral region Q2. The plurality of second conductive structures 800 each extend in the second direction Y and are arranged side by side in the first direction X. The second conductive structures 800 intersect with the first conductive structures 700, and are electrically connected with the first conductive structures 700 through vias penetrating through the interlayer insulation layer 50. The near field communication antenna is disposed on the base substrate 10 in the display region Q1. Each near field communication antenna includes at least one coil part 70, including a plurality of first conductive lines 701 and a plurality of second conductive lines 702, with the first conductive lines 701 intersecting with the second conductive lines 702. Each first conductive line 701 forms at least a partial structure of one of the first conductive structures 700, and part of the first conductive structures each include two first conductive lines 701; and each second conductive line 702 forms at least a partial structure of one of the second conductive structures 800.

It should be noted that in the embodiment of the present disclosure, the purpose of providing part of the first conductive structures 700 including two first conductive lines 701 is to form a bent pattern and thus form the coil part 70. When the near field communication antenna includes only one coil part 70, both ends of the coil part 70 are connected to a control circuit to form a closed loop. In this case, an external magnetic induction coil may form an induced current loop in the near field communication antenna and the control circuit, thereby completing the near field communication. When a plurality of coil parts 70 are provided, the plurality of coil parts 70 may be connected by a connection jumper 130 to form an antenna coil. In this case, both ends of the antenna are connected to the control circuit to form a closed loop, and an induced current loop may be formed in the near field communication antenna and the control circuit through an external magnetic induction coil, thereby completing the near field communication. The specific structure will be described in the following specific examples.

In the embodiment of the present disclosure, the coil part 70 of the near field communication antenna is integrated in the display region Q1, which helps to save space and obtain a thinner and lighter display substrate. Meanwhile, since the coil part 70 is formed of the first conductive lines 701 and the second conductive lines 702, with the first conductive lines 701 intersecting with the second conductive lines 702, that is, the coil part 70 has a mesh structure, it will not affect the display effect of the display apparatus to which the display substrate is applied. In addition, since each first conductive line 701 in the coil part 70 forms at least a partial structure of one of the first conductive structures 700, each second conductive line 702 forms at least a partial structure of one of the second conductive structures 800, and the first conductive structures 700 and the second conductive structures 800 are located in the display region Q1 and the peripheral region Q2, it ensures the display uniformity of the display apparatus to which the display substrate is applied.

Figure 5:
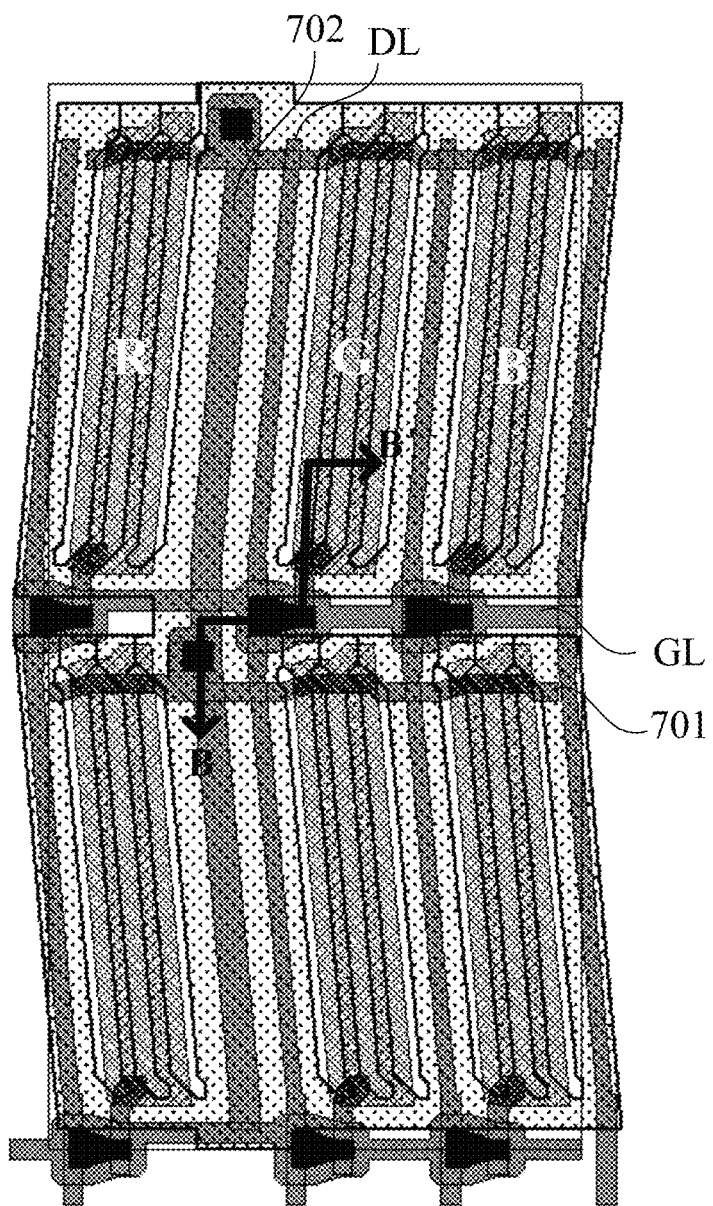
FIG. 5 is a layout of a display substrate according to an embodiment of the present disclosure.

In some examples, FIG. 5 is a layout of a display substrate according to an embodiment of the present disclosure. As shown in FIG. 5, in addition to the above structures, the display substrate further includes a plurality of gate lines GL, a plurality of data lines DL, and a plurality of sub-pixels on the base substrate 10. The gate lines GL are located in the display region Q1 and the peripheral region Q2, and each extend in the first direction X and are arranged side by side in the second direction Y. The data lines DL are located in the display region Q1 and the peripheral region Q2, and each extend in the second direction Y and are arranged side by side in the first direction X. The sub-pixels are defined by the gate lines GL and the data lines DL, with the gate lines GL intersecting with the data lines DL. The sub-pixels arranged side by side in the first direction X form a first pixel group; and the sub-pixels arranged side by side in the second direction Y form a second pixel group. In the embodiment of the present disclosure, any adjacent first pixel groups are provided with one of the first conductive structures 700 therebetween; and at least part pairs of adjacent second pixel groups each are provided with one of the second conductive structures 800 between the adjacent second pixel groups.

It should be noted that, any adjacent first pixel groups being provided with one of the first conductive structures 700 therebetween does not mean that an overall projection of the first conductive structures 700 on the base substrate 10 is completely located between orthographic projections of adjacent first pixel groups on the base substrate 10. In the embodiment of the present disclosure, the first conductive structure 700 is considered to be located between two adjacent first pixel groups as long as a partial structure of the first conductive structure 700 is located between the two adjacent first pixel groups. For example, as shown in FIG. 5, an orthogonal projection of a part of the first conductive structure 700 (i.e., the first body part 710 described below) extending in the first direction X on the base substrate 10 overlaps an orthogonal projection of the sub-pixel on the base substrate 10, but an orthogonal projection of a part of the first conductive structure 700 (i.e., the first connection part 720 described below) extending in the second direction Y on the base substrate 10 does not overlap an orthogonal projection of the sub-pixel on the base substrate 10, and is located between two first pixel groups. Since positions between the first pixel groups and positions between the second pixel groups are non-light-transmitting regions, by providing each first conductive structure 700 between adjacent first pixel groups, and each second conductive structure 800 between adjacent second pixel groups, it will not affect the pixel aperture ratio.

In some examples, in the embodiment of the present disclosure, the sub-pixels in a same second pixel group have a same color, and the sub-pixels in the adjacent second pixel groups have different colors. In an example, the display substrate includes sub-pixels of three colors, for example, the sub-pixels of three colors may include a red sub-pixel R, a green sub-pixel G, and a blue sub-pixel B, respectively.

Every three sub-pixels arranged side by side in the first direction X form a pixel unit. That is, each pixel unit includes a red sub-pixel, a green sub-pixel, and a blue sub-pixel. The pixel units arranged side by side in the second direction Y form a pixel unit group: where each pixel unit group is provided with at least one second conductive structure 800.

Further, in an example, in each pixel unit group, any adjacent second pixel groups are provided with the second conductive structure 800 therebetween. That is, each pixel unit group is provided therein with two second conductive structures 800, one second conductive structure 800 is located between the second pixel group formed by red sub-pixels R and the second pixel group formed by green sub-pixels G, and the other second conductive structure 800 is located between the second pixel group formed by green sub-pixels R and the second pixel group formed by blue sub-pixels B. In another example, each pixel unit group is provided with one second conductive structures 800, and the second conductive structure 800 is located between the second pixel group formed by red sub-pixels R and the second pixel group formed by green sub-pixels G. Such arrangement is provided because the red sub-pixels R have a higher risk of color crosstalk, and therefore, the black matrix is formed with a larger line width at the position between the corresponding red sub-pixels R and green sub-pixels G in the color filter substrate than at other positions. Therefore, the second conductive structure 800 provided at that position will not affect the pixel aperture ratio.

It should be noted that the drawings and the following description of the embodiments of the present disclosure all take the case where only one second conductive structure 800 is provided in each pixel unit group, and the second conductive structure 800 is located between the red sub-pixels and the green sub-pixels as an example. However, it will be appreciated that this does not form any limitation to the scope of the embodiments of the present disclosure.

Figure 6:
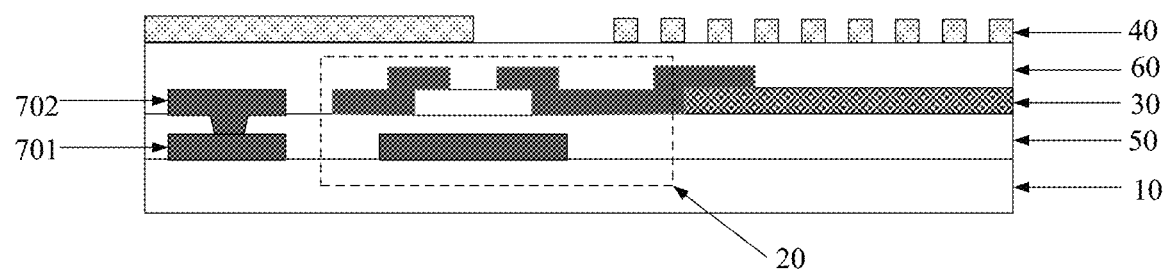
FIG. 6 is a cross-sectional view taken along B-B' of the display substrate shown in FIG. 5.

In some examples, FIG. 6 is a cross-sectional view taken along B-B' of the display substrate shown in FIG. 5. As shown in FIG. 6, each sub-pixel includes at least a thin film transistor 20, a pixel electrode 30, and a common electrode 40. The display substrate includes a first conductive layer, an interlayer insulation layer 50 (serving as a gate insulation layer), a pixel electrode 30, a second conductive layer, a passivation layer 60, and a common electrode 40 which are sequentially disposed on the base substrate 10. The first conductive layer includes a gate of the thin film transistor 20, the gate lines GL, and the first conductive structures 700. The gate of the thin film transistor 20 and the gate line GL are electrically connected, and may form into one piece. The second conductive layer includes a source and a drain of the transistor 20, the data lines DL, and the second conductive structures 800. The drain of the thin film transistor 20 is electrically connected to the pixel electrode 30; the source of the thin film transistor 20 and the data line DL are electrically connected, and may form into one piece; and the second conductive structures 800 are electrically connected to the first conductive structures 700 through vias penetrating through the interlayer insulation layer. The pixel electrode 30 is a plate electrode, and the common electrode 40 is a slit electrode.

In this case, the first conductive layer includes a gate of the thin film transistor 20, the gate lines GL, and the first conductive structures 700. The second conductive layer includes a source and a drain of the thin film transistor 20, the data lines DL, and the second conductive structures 800.

In this case, the gate of the thin film transistor 20, the gate lines GL, and the first conductive structures 700 may be formed through a single patterning process; and the source and the drain of the thin film transistor 20, the data lines DL, and the second conductive structures 800 may be formed through a single patterning process. In the embodiment of the present disclosure, each first conductive line 701 of the near field communication antenna forms at least a partial structure of one of the first conductive structures 700, and each second conductive line 702 forms at least a partial structure of one of the second conductive structures 800. As result, although the near field communication antenna is integrated in the display substrate, no process step is added.

Figure 7:
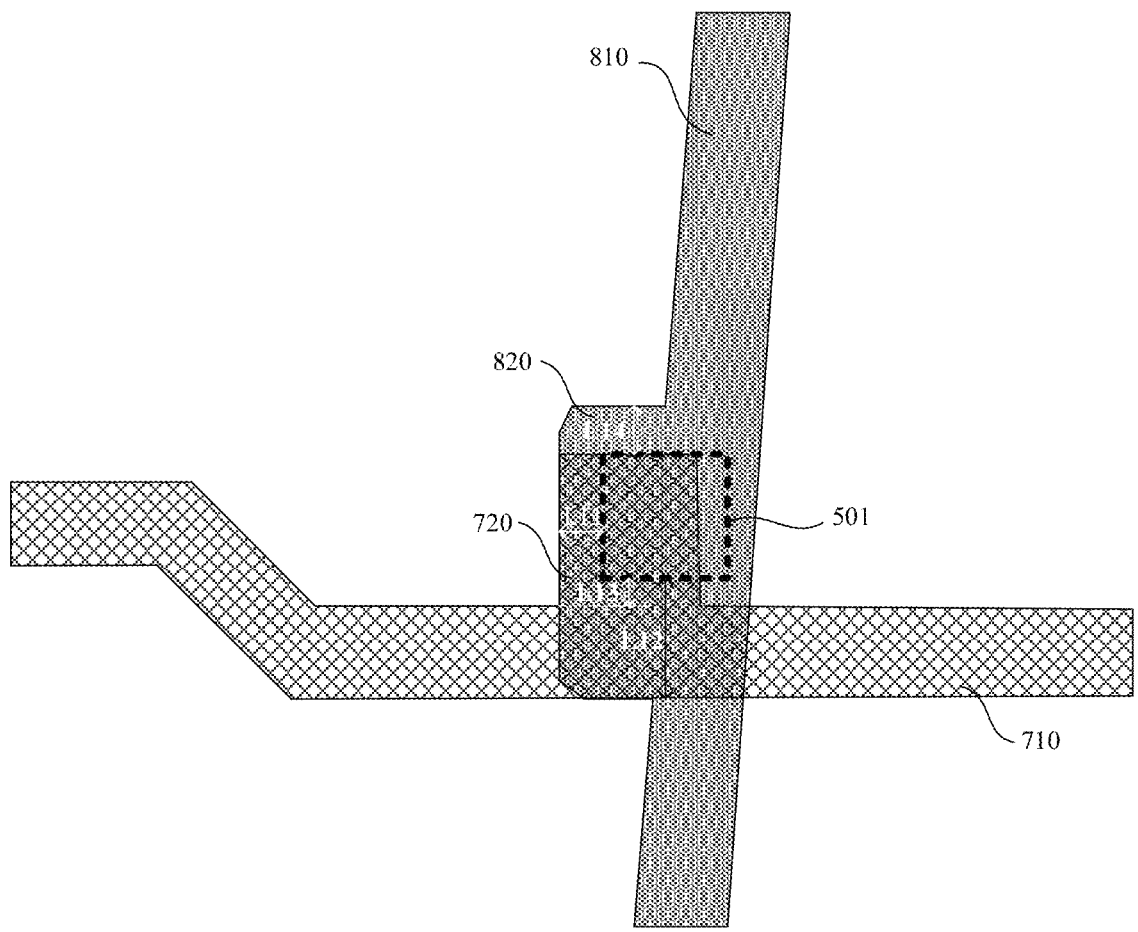
FIG. 7 is a schematic diagram showing an electrical connection between a first conductive structure and a second conductive structure in a display substrate according to an embodiment of the present disclosure.

In the embodiment of the present disclosure, since each first conductive line 701 of the near field communication antenna forms at least a partial structure of one of the first conductive structures 700, and each second conductive line 702 forms at least a partial structure of one of the second conductive structures, it is ensured that positions of the first conductive structure 700 and the second conductive structure 800, as well as matching relationship between the connection of the first conductive structure 700 and the second conductive structure 800, and the via, are reasonable, so that the performance of the near field communication antenna is guaranteed. In some examples, FIG. 7 is a schematic diagram showing an electrical connection between the first conductive structure 700 and the second conductive structure 800 in the display substrate according to an embodiment of the present disclosure. The first conductive structure 700 includes a first body part 710 and a first connection part 720. The first body part 710 extends in the first direction X, and the first connection part 720 is connected to the first body part 710. The second conductive structure 800 includes a second body part 810 and a second connection part 820. The second body part 810 extends in the second direction Y, and the second connection part 820 is connected to the second body part 810. For the first conductive structure 700 and the second conductive structure 800 which are intersected with each other, the first connection part 720 of the first conductive structure 700 is electrically connected to the second connection part 820 of the second conductive structure 800 through a via penetrating through the interlayer insulation layer 50.

Figure 8:
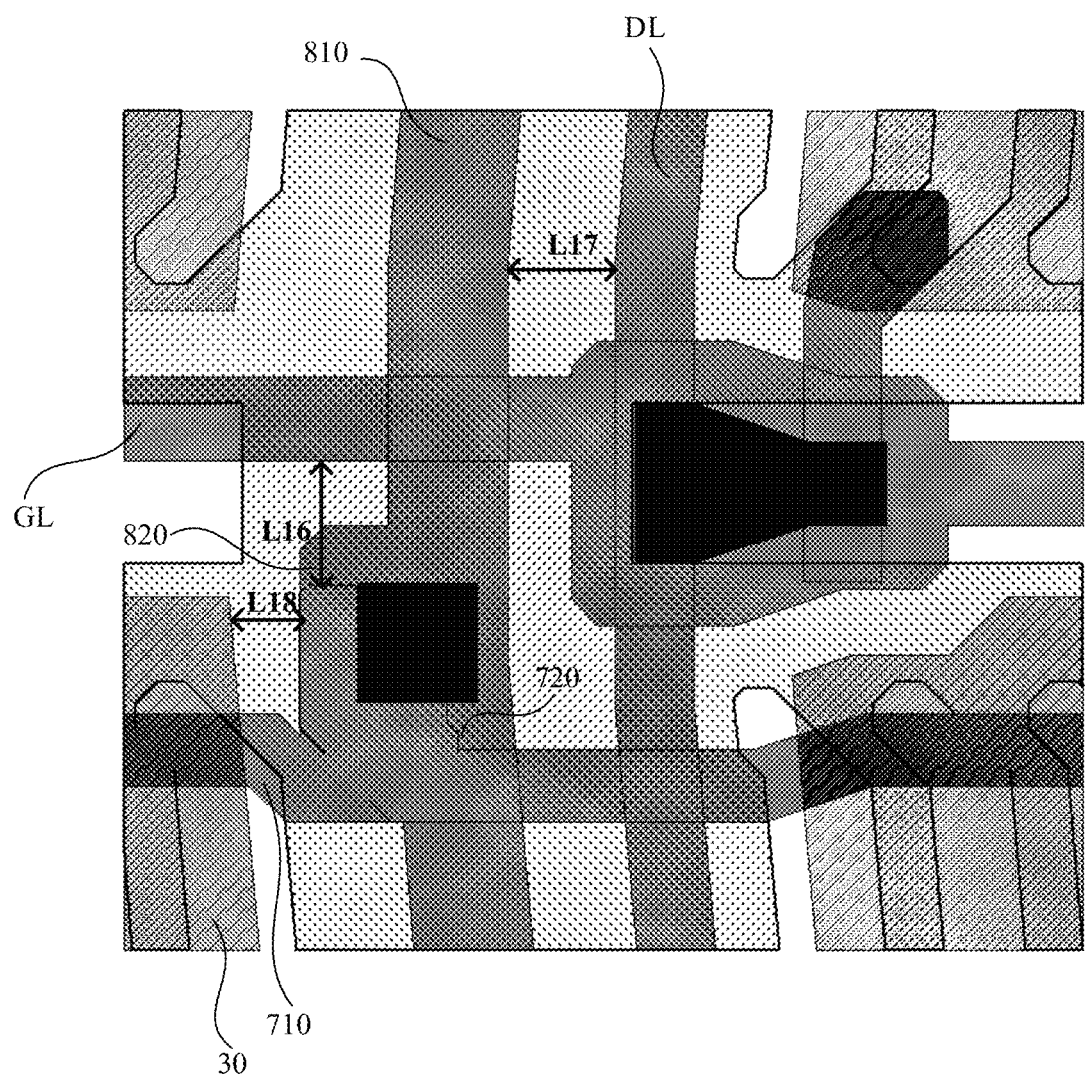
FIG. 8 is a partial position diagram of a layout of a display substrate according to an embodiment of the present disclosure.

For example, FIG. 8 is a partial position diagram of a layout of a display substrate according to an embodiment of the present disclosure. As shown in FIG. 8, the first connection part 720 is located between the first body part 710 connected thereto and the gate line GL closest to the first body part 710; and the second connection part 820 is located on a side of the second body part 810 connected thereto away from the data line DL closest to the second body part 810. The first connection part 720 and the second connection part 820 each include a first (left) side edge and a second (right) side edge which are disposed oppositely in the first direction X, and a third (lower) side edge and a fourth (upper) side edge which are disposed oppositely in the second direction Y. The third side edge of the first connection part 720 is connected to the first body part 710; and the second side edge of the second connection part 820 is connected to the second body part 810. Orthographic projections of the first connection part 720 and the second connection part 820 on the base substrate 10 at least partially overlap, and each at least cover at least a partial region of an orthographic projection of the via on the base substrate 10. As shown in FIG. 7, a distance L11 from an orthographic projection of the first side edge of the first connection part 720 on the base substrate 10 to the orthographic projection of the via on the base substrate 10, and a distance L13 from an orthographic projection of the third side edge on the base substrate 10 to the orthographic projection of the via on the base substrate 10 each are not less than 2.0 μm. For example, the distance L11 from the orthogonal projection of the first side edge of the first connection part 720 on the base substrate 10 to the orthographic projection of the via on the base substrate 10 is 2.4 μm, and the distance L13 from the orthogonal projection of the third side edge of the first connection part 720 on the base substrate 10 to the orthographic projection of the via on the base substrate 10 is 2.0 μm. Distances L14 from orthographic projections of the first side edge, the third side edge and the fourth side edge of the second connection part 820 on the base substrate 10 to the orthographic projection of the via on the base substrate 10 each are not less than 2.0 μm. For example, the distances L14 from orthographic projections of the first side edge, the third side edge and the fourth side edge of the second connection part 820 on the base substrate 10 to the orthographic projection of the via on the base substrate 10 each are 2.4 μm. In addition, the farthest distance L12 from the orthographic projection of the via on the base substrate 10 to the orthographic projection of the first body part 710 of the first conductive structure 700 on the base substrate 10 is not less than 4 μm. For example, the farthest distance L12 from the orthographic projection of the via on the base substrate 10 to the orthographic projection of the first body part 710 of the first conductive structure 700 on the base substrate 10 is about 5 μm.

In some examples, since the first conductive structure 700 serves as at least a partial structure of the first conductive line 701 of the near field communication antenna, and the first conductive structure 700 is disposed in the same layer as the gate line GL, it should guarantee that a distance between the first conductive structure 700 and the gate line GL is set to prevent the near field communication antenna from affecting a signal on the gate line GL. In the embodiment of the present disclosure, as shown in FIG. 8, a distance L16 between the first connection part 720 of the first conductive structure 700 and the gate line GL closest thereto is not less than 4 μm, for example, L16 is about 5.2 μm, so that signal interference can be effectively avoided, and meanwhile, since the first conductive structure 700 is disposed in the same layer as the gate line, an exposure interval when the first conductive structure 700 and the gate line being patterned can be ensured by reasonably setting a distance between the first conductive structure 700 and the gate line.

Similarly, since the second conductive structure 800 serves as at least a partial structure of the second conductive line 702 of the near field communication antenna in a same layer, and the second conductive structure 800 is disposed in the same layer as the data lines DL, it should guarantee that a distance between the second conductive structure and the data line DL is set to prevent the near field communication antenna from affecting a signal on the data line DL. As shown in FIG. 8, in the embodiment of the present disclosure, a distance L17 between the second body part 810 and the data line DL closest thereto is not less than 3.5 μm: for example, L17 is about 4.5 μm. In addition, the drain of the thin film transistor 20 is directly electrically connected to the pixel electrode 30, and therefore, except the portion electrically connected to the drain of the thin film transistor 20, the pixel electrode 30 is disposed in the same layer as the second conductive structure 800 at other positions. In order to prevent the second conductive structure 800 from affecting a voltage signal on the pixel electrode 30, in the embodiment of the present disclosure, a distance L18 between the second connection part 820 and the pixel electrode 30 closest thereto is not less than 2.0 μm. For example, the distance L18 between the second connection part 820 and the pixel electrode 30 closest thereto ranges from about 2.5 μm or 2.99 μm.

Figure 9:
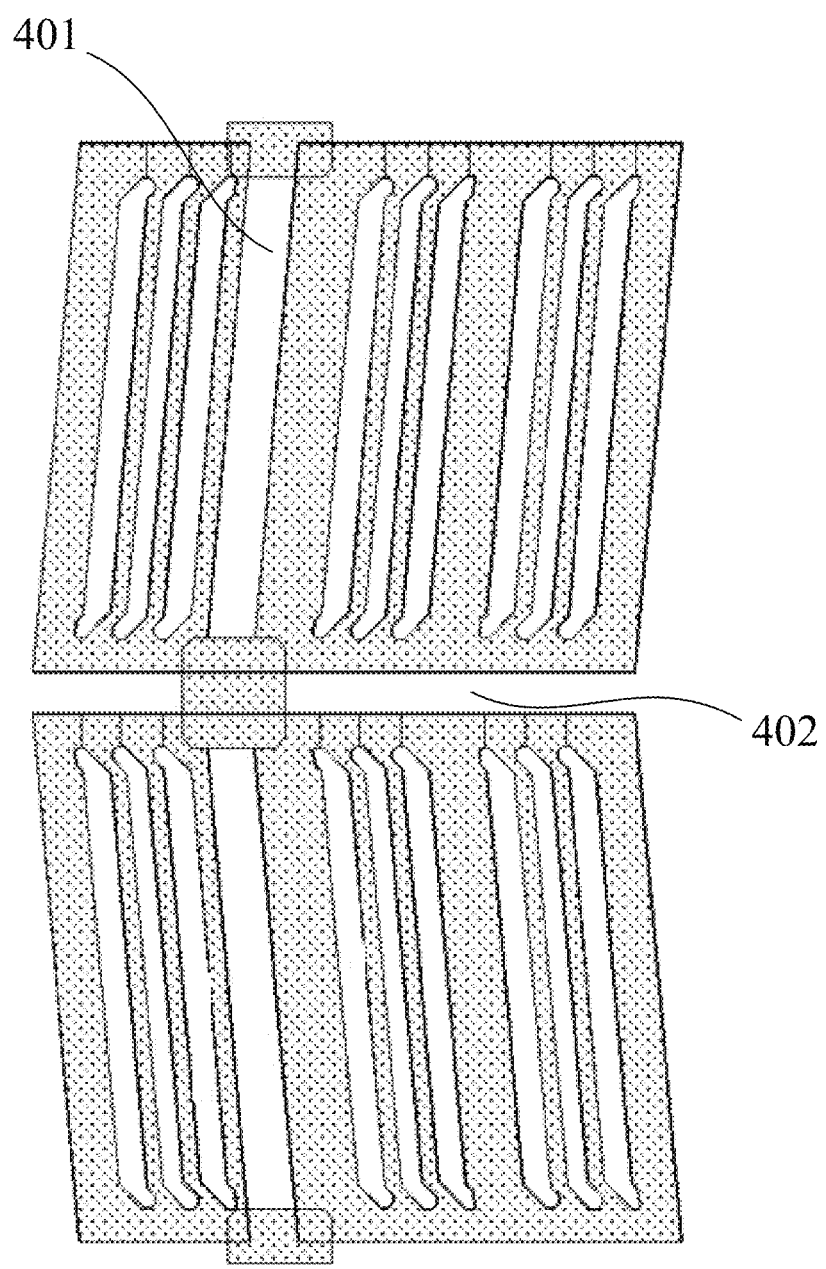
FIG. 9 is a layout of a common electrode layer in a display substrate according to an embodiment of the present disclosure.

In some examples, FIG. 9 is a layout of a common electrode layer in a display substrate according to an embodiment of the present disclosure. As shown in FIG. 9, since the first conductive line 701 of the coil part 70 of the near field communication antenna is disposed in the first conductive layer, the second conductive line 702 is disposed in the second conductive layer, and the common electrodes 40 in different sub-pixels are typically connected together, that is, the common electrodes 40 in different sub-pixels form a common electrode layer on a side of the second conductive layer away from the base substrate, in order to prevent the common electrode layer from affecting signal transmission over the near field communication antenna, a plurality of first openings 401 are provided in the common electrode layer. The first openings 401 each extend in the second direction Y and are arranged side by side in the first direction X. An orthographic projection of each first opening 401 on the base substrate 10 partially overlaps an orthographic projection of one of the second conductive structures 800 on the base substrate 10. For example, the first openings 401 are disposed in correspondence with the second conductive structures 800 one to one. Further, since the common electrode 40 in the embodiment of the present disclosure is a slit electrode, orthographic projections of the first conductive structures 700 and the common electrode 40 on the base substrate 10 at least partially overlap, so that slits in the common electrode 40 can be used to facilitate signal transmission over the near field communication antenna. In some examples, the common electrode layer further includes a plurality of second openings 402 which each extend in the first direction X and are arranged side by side in the second direction Y. An orthographic projection of each second opening 402 on the base substrate 10 at least partially overlaps an orthogonal projection of the thin film transistors 20 arranged side by side in the first direction X on the base substrate 10. In this case, although there is a certain distance between each second opening 402 and the second conductive line 702 of the near field communication antenna, the second opening 402 can also assist signal transmission over the near field communication antenna.

In the embodiment of the present disclosure, the display region Q1 includes at least one first region Q11 and at least one second region Q12. The first region Q11 is configured to be provided with the near field communication antenna, and each first region Q11 is provided with the coil part 70 of one near field communication antenna. Other regions of the display region Q1 except the first region Q11 are collectively referred to as the second region Q12. The peripheral region Q2 includes a first pad region Q21 and a second pad region Q22 on opposite sides of the display region Q1 in the second direction Y. When the display region Q1 includes only one first region Q11, the one first region Q11 may be disposed on a side of the second region Q12 close to the first pad region Q21, or on a side of the second region Q12 close to the second pad region Q22. This may facilitate binding of the near field communication antenna in the first region Q11 with a flexible circuit board. Similarly, when the display region Q1 includes two first regions Q11, one of the first regions Q11 is disposed on the side of the second region Q12 close to the first pad region Q21, and the other first region Q11 is disposed on the side of the second region Q12 close to the second pad region Q22. Alternatively, in the embodiment of the present disclosure, more first regions Q11 may be provided in the display region Q1 of the display substrate, that is, coil parts 70 of more near field communication antennas may be integrated in the display substrate. It should be noted that the signal line on the display substrate is typically bonded and connected to the flexible circuit board via the first pad region Q21. In some implementations, the near field communication antenna is located on a side of the display region close to the second pad region Q22. In this case, the flexible printed circuit board bonded to the near field communication antenna, and the flexible printed circuit board bound to the first pad region Q21, are not a same flexible circuit board. Therefore, interference between the signal line on the display substrate and the coil part 70 of the near field communication antenna can be avoided, and a sufficient space can be reserved for bonding the coil part 70 of the near field communication antenna.

In the following description, only the case where the display region Q1 of the display substrate has one or two first regions Q11, that is, coil parts 70 of one or two near field communication antennas are integrated in the display substrate, is described.

Figure 10:
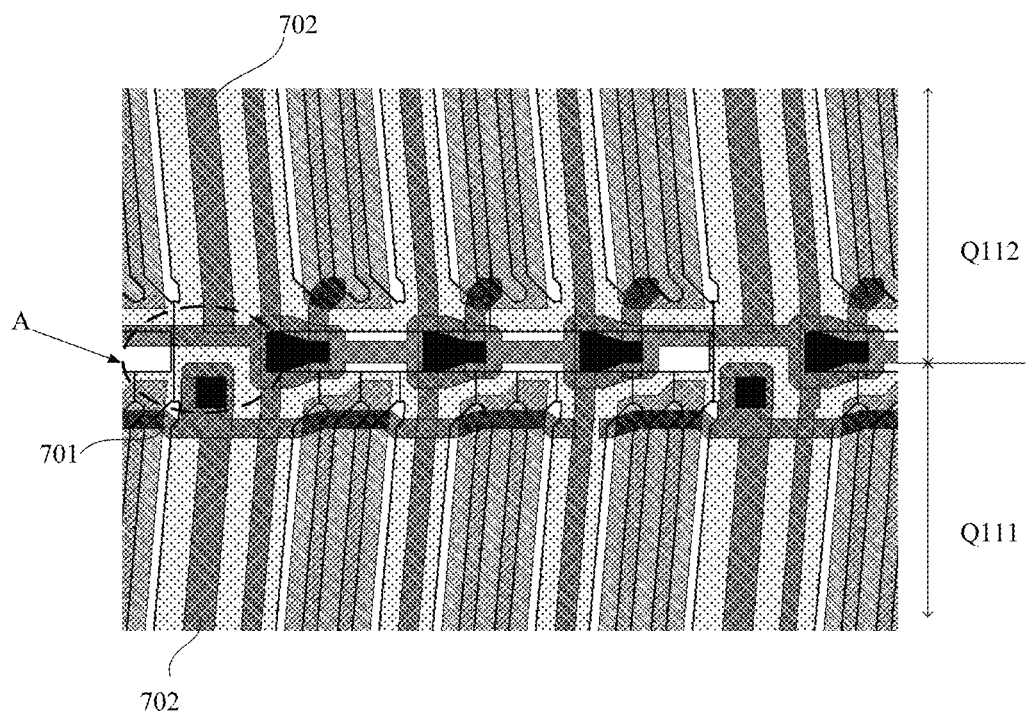
FIG. 10 is a partial position diagram of a layout of a display substrate according to an embodiment of the present disclosure.
Figure 11:
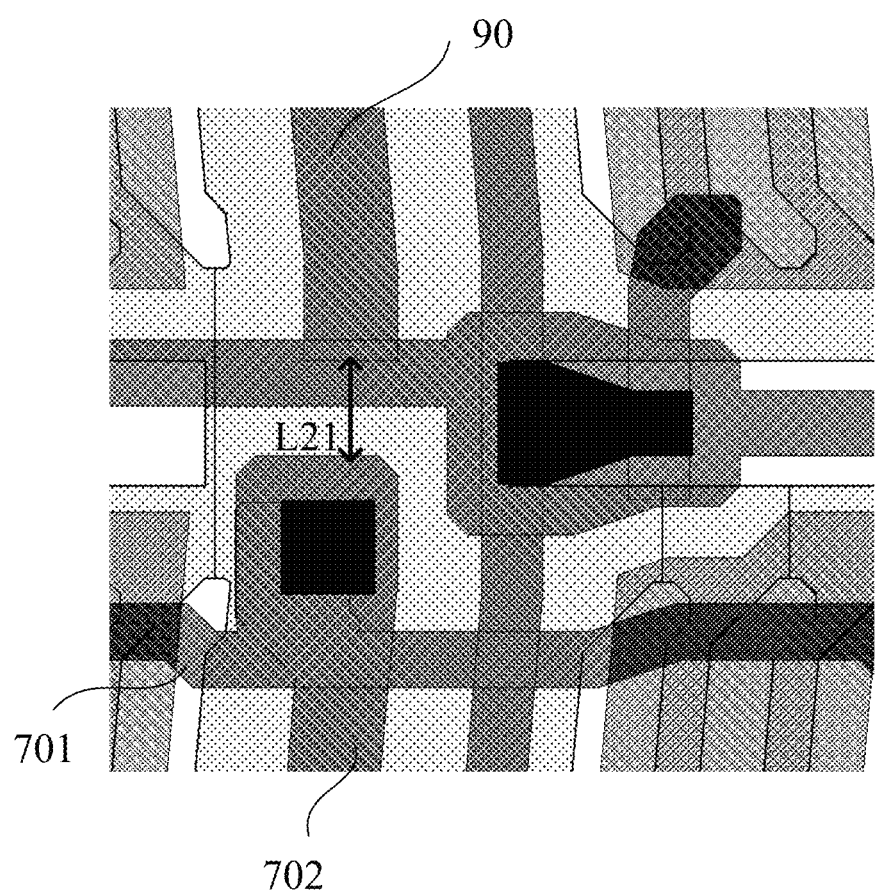
FIG. 11 is an enlarged view of position A in FIG. 10.

In some examples, FIG. 10 is a partial position diagram of a layout of a display substrate according to an embodiment of the present disclosure, and FIG. 11 is an enlarged view of position A in FIG. 10. As shown in FIGS. 4, 10 and 11, the display substrate includes not only the coil part 70 disposed in the first region Q11, but also a plurality of third conductive lines 110 and a plurality of fourth conductive lines 120 in the second region Q12 and the peripheral region Q2. The plurality of third conductive lines 110 intersect with the plurality of fourth conductive lines 120, and each third conductive line 110 forms at least a partial structure of one of the first conductive structures 700, and each fourth conductive line 120 is a partial structure of one of the second conductive structures 800. In this case, the first conductive structures 700 and the second conductive structures 800 are uniformly distributed in the display region Q1, which helps to provide a uniform aperture ratio of the display substrate. In order to prevent a signal on the coil part 70 from being coupled into the second region Q12, the second conductive line 702 and the fourth conductive line 120 belonging to a same second conductive structure 800 are disconnected by a distance L21 ranging from about 2 μm to 6 μm, for example, being 4 μm.

Further, the display substrate further includes, in addition to the above structures, a common electrode line 400 on the base substrate 10 in the peripheral region Q2. When the third and fourth conductive lines 110 and 120 are disposed in the second region Q12, the third conductive lines 110 may be electrically connected to the common electrode line 400. For example, the common electrode line 400 includes a first common electrode sub-line extending in the first direction, and a second common electrode sub-line extending in the second direction. The first common electrode sub-line may be disposed in the same layer and made of the same material as the first conductive structures 700; and the second common electrode sub-line may be disposed in the same layer and made of the same material as the second conductive structure 800. In this case, the first common electrode sub-line is electrically connected to the second common electrode sub-line through a via penetrating through the interlayer insulation layer 50. Each third conductive line 110 is electrically connected to the second common electrode sub-line through a via penetrating the interlayer insulation layer 50 so that voltages on the third conductive lines 110 and the fourth conductive lines 120 share a common voltage, thereby preventing the third conductive lines 110 and the fourth conductive lines 120 from entering a floating state. Alternatively, each fourth conductive line 120 is electrically connected to the first common electrode sub-line through a via penetrating the interlayer insulation layer 50 so that voltages on the third conductive lines 110 and the fourth conductive lines 120 share a common voltage. Alternatively, it is also possible that each third conductive line 110 is electrically connected to the second common electrode sub-line through a via penetrating the interlayer insulation layer 50, and meanwhile each fourth conductive line 120 is electrically connected to the first common electrode sub-line through a via penetrating the interlayer insulation layer 50, so that voltages on the third conductive lines 110 and the fourth conductive lines 120 share a common voltage.

It should be noted that when the peripheral region has a rectangular contour, the common electrode line 400 may include two first common electrode sub-lines and two second common electrode sub-lines. The two first common electrode sub-lines are arranged side by side in the second direction, and the two second common electrode sub-lines are arranged side by side in the first direction. When the third conductive line 110 is connected to the second common electrode sub-lines, two ends of the third conductive line 110 may be connected to the two second common electrode sub-lines, respectively (two ends of the third conductive line 110 are connected to the first common electrode sub-lines closest thereto, respectively). When the fourth conductive line 120 is connected to the first common electrode sub-lines, an end of the fourth conductive line 120 away from the first region Q11 is connected to the second common electrode sub-line closest thereto.

Figure 12:
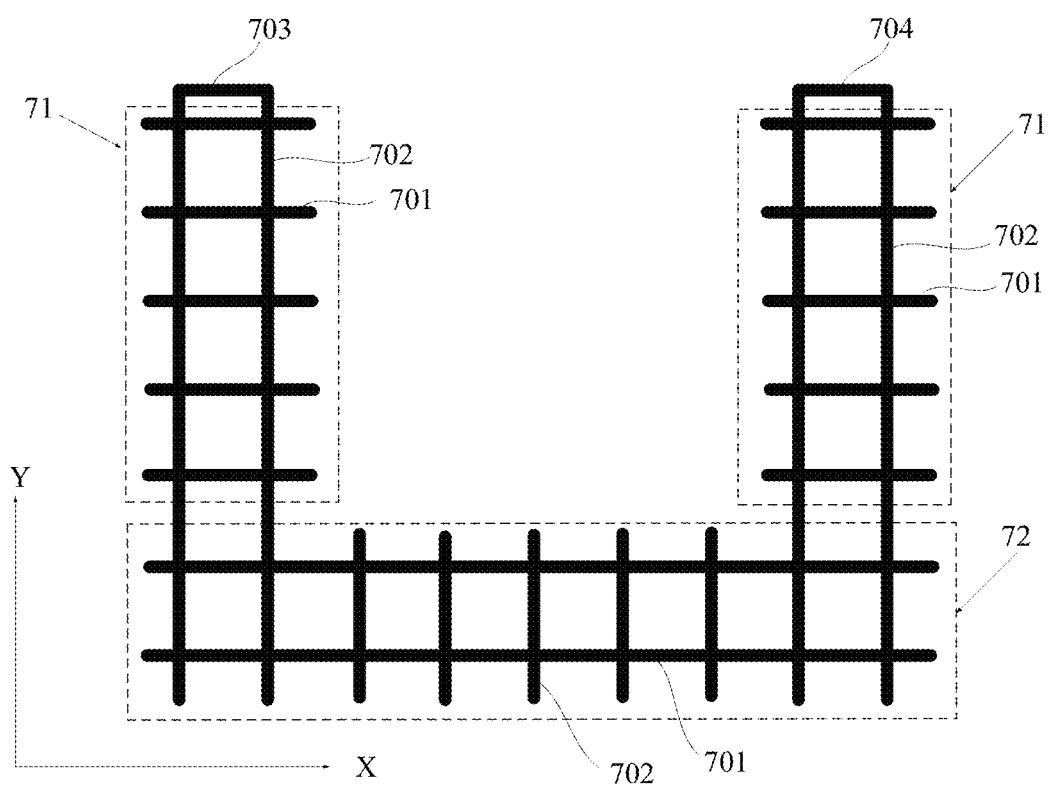
FIG. 12 is a schematic diagram of a near field communication antenna in a display substrate according to an embodiment of the present disclosure.

In some examples, FIG. 12 is a schematic diagram of a near field communication antenna in a display substrate according to an embodiment of the present disclosure. As shown in FIG. 12, the near field communication antenna may include only one coil part 70. The coil part 70 may include at least two sub-structures extending in different directions. Each of the sub-structures includes the first conductive line 701 and the second conductive line 702. For example, the coil part 70 has a V-shape, a U-shape, or the like. In the embodiment of the present disclosure, the description is made by taking the coil part 70 in a U shape as an example. As shown in FIG. 12, the coil part 70 includes two first sub-structures 71 which are arranged side by side in the first direction X and each extend in the second direction Y, and one second sub-structure 72 extending in the first direction X and connected between the two first sub-structures 71. As shown in FIG. 4, the first region Q11 in the display region Q1 includes a non-functional region Q112, and a functional region Q111 surrounding the non-functional region Q112. The coil part 70 is disposed in the functional region Q111. For example, the functional region Q111 has a shape adapted to the shape of the coil part 70. That is, when the coil part 70 has a U shape, the functional region Q111 also has a U shape. In this case, the non-functional region Q112 has a rectangular shape. Further, the display substrate further includes, in addition to the above structures, a plurality of fifth conductive lines 80 and a plurality of sixth conductive lines 90 disposed on the base substrate 10 in the non-functional region Q112, and the fifth conductive lines 80 intersect with the sixth conductive lines 90. Each fifth conductive line 80 is a partial structure of one of the first conductive structures 700, and each sixth conductive line 90 is a partial structure of one of the second conductive structures 800.

Figure 13:
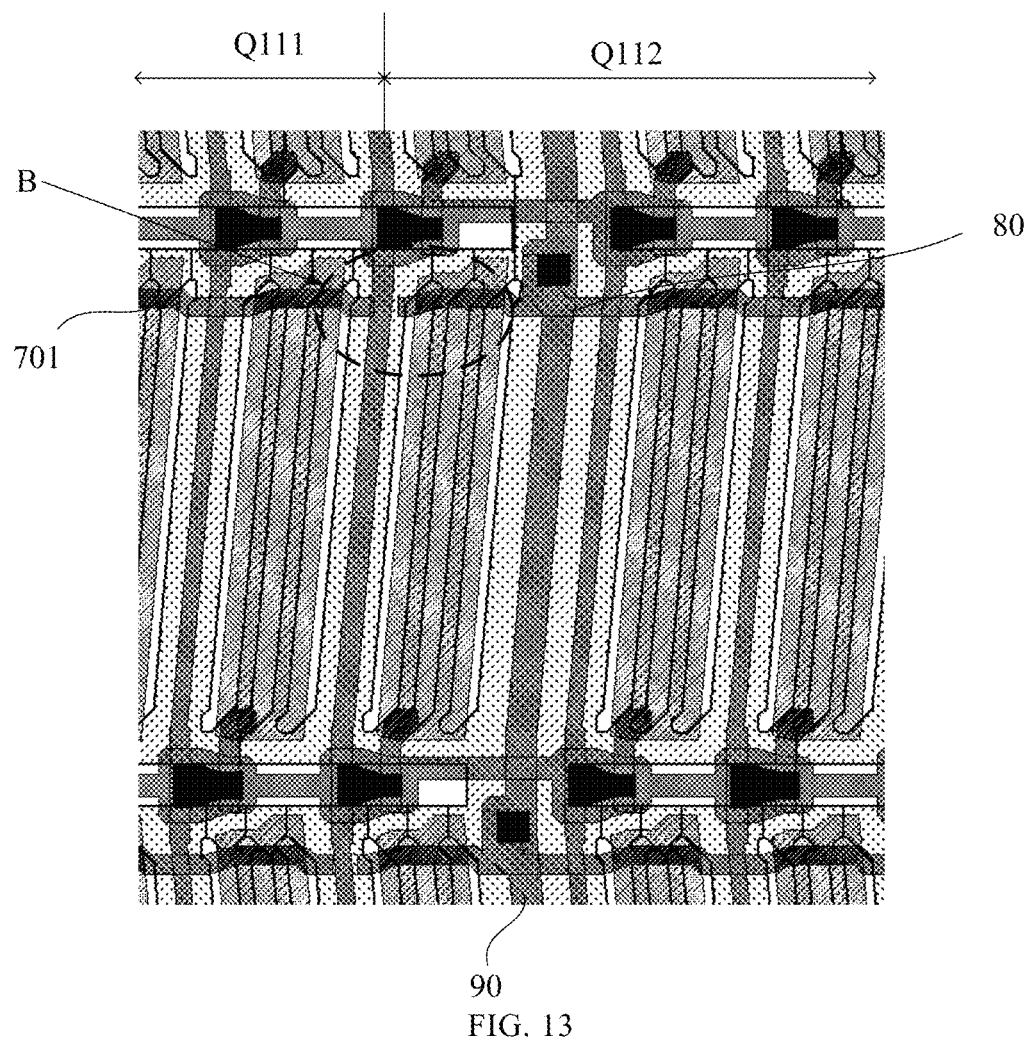
FIG. 13 is a partial position diagram of a layout of a display substrate according to an embodiment of the present disclosure.
Figure 14:
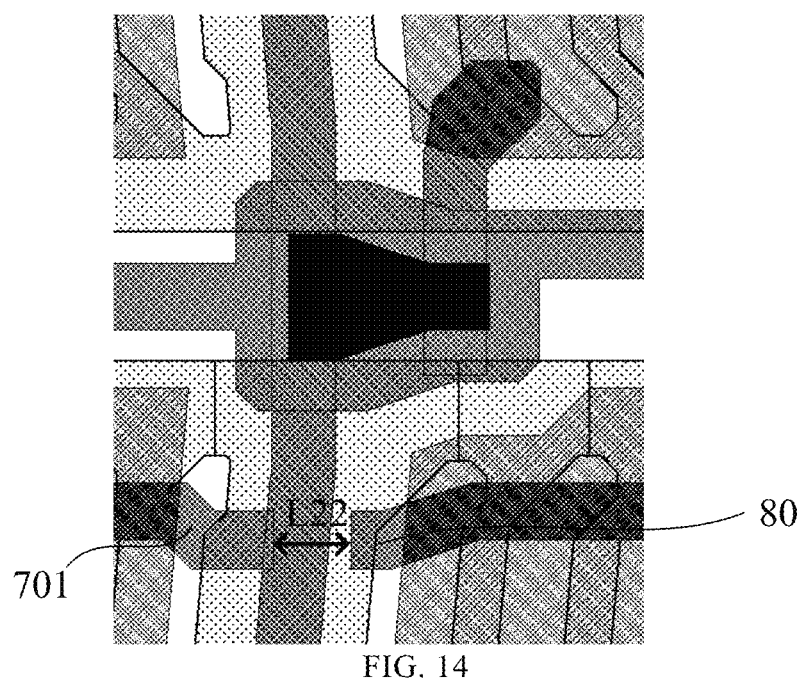
FIG. 14 is an enlarged view of position B in FIG. 13.

In an example, FIG. 13 is a partial position diagram of a layout of a display substrate according to an embodiment of the present disclosure, and FIG. 14 is an enlarged view of position B in FIG. 13. As shown in FIGS. 13 and 14, among the plurality of first conductive structures 700 extending through the first region Q11, each first conductive structure 700 extending through both the functional region Q111 and the non-functional region Q112 includes a first conductive line 701 and a fifth conductive line 80, and a distance L22 between the fifth conductive line 80 and the first conductive line 701 is between 2 μm and 6 μm: for example, L22 is about 4 μm. In other words, the first conductive line 701 and the fifth conductive line 80 of a same first conductive structure 700 are disconnected by a certain distance. By providing the above distance, the signal over the near field communication antenna is effectively prevented from being coupled into the fifth conductive line 80 to affect performance of the display substrate. Similarly, among the plurality of second conductive lines 702 extending through the first region Q11, each second conductive structure 800 extending through both the functional region Q111 and the non-functional region Q112 includes a second conductive line 702 and a sixth conductive line 90, and a distance between the sixth conductive line 90 and the second conductive line 702 is between 2 μm to 6 μm: for example, the distance is about 4 μm. That is to say, the second conductive line 702 and the sixth conductive line 90 of a same second conductive structure 800 are disconnected by a certain distance. By providing the above distance, the signal over the near field communication antenna is effectively prevented from being coupled into the sixth conductive line 90 to affect performance of the display substrate.

Figure 15:
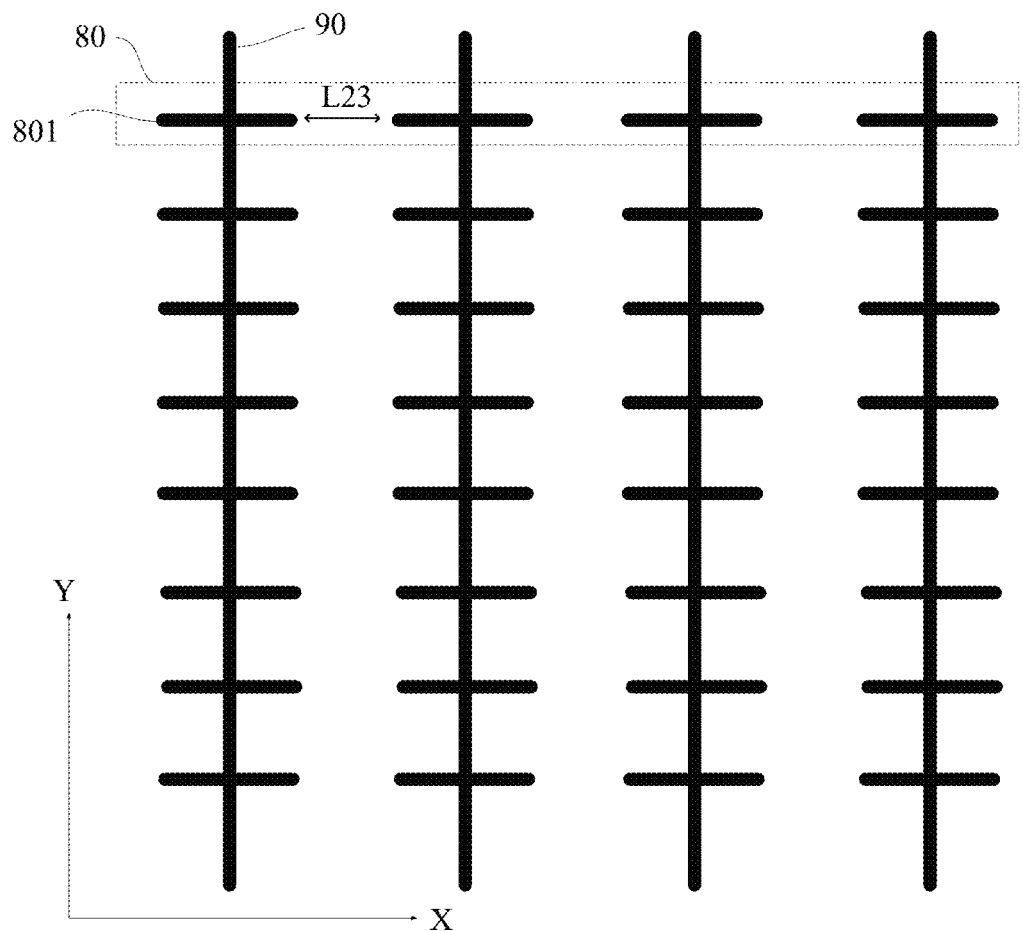
FIG. 15 is a schematic wiring diagram of a non-functional region in a display substrate according to an embodiment of the present disclosure.

Further, FIG. 15 is a schematic wiring diagram of a non-functional region Q112 in a display substrate according to an embodiment of the present disclosure. As shown in FIG. 15, in order to prevent the signal over the near field communication antenna from being coupled into the non-functional region Q112 as much as possible, in the embodiment of the present disclosure, the fifth conductive lines 80 are designed to be broken. For example, as shown in FIG. 15, each fifth conductive line 80 includes a plurality of first conductive sub-lines 801 arranged side by side and at intervals in the first direction X; and a gap between adjacent first conductive sub-lines 801 is located between adjacent sub-pixels. The gap between adjacent first conductive sub-lines 801 has a width L23 ranging from 2 μm to 6 μm: for example, L23 is about 4 μm.

When the peripheral region Q2 of the display substrate is provided with the common electrode line 400 as described above, and the non-functional region Q112 is provided with the fifth conductive lines 80 and the sixth conductive lines 90, the sixth conductive lines 90 may be electrically connected to the common electrode line 400. For example, the common electrode line 400 includes the first common electrode sub-line and the second common electrode sub-line as described above, and each sixth conductive line 90 is electrically connected to the first common electrode sub-line through a via penetrating through the interlayer insulation layer 50, so that voltages on the fifth conductive lines 80 and the sixth conductive lines 90 share a common voltage, thereby preventing the fifth conductive lines 80 and the sixth conductive lines 90 from entering a floating state. In some implementations, an end of each sixth conductive line 90 away from the second region Q12 is electrically connected to the first sub-common line closest thereto.

Figure 16:
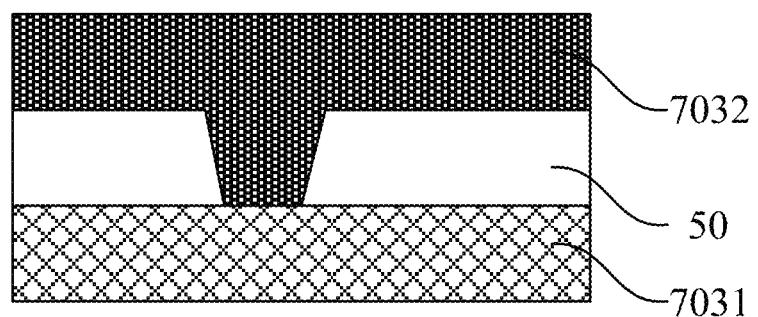
FIG. 16 is a schematic diagram of a first extraction electrode (a second extraction electrode) in a display substrate according to an embodiment of the present disclosure.

In some examples, when the near field communication antenna includes only one coil part 70 as described above, the first end and the second end of the coil part 70 are to be electrically connected to the control circuit on the flexible circuit board to achieve a magnetic induction function of the near field communication antenna. Also taking the coil part 70 in a U shape as an example, ends of two first sub-structures 71 of the coil part 70 respectively serve as the first end and the second end of the coil part 70. The ends of the two first sub-structures 71 extend from the display region Q1 to the peripheral region Q2. Meanwhile, since the second conductive lines 702 at the ends of the two first sub-structures 71 are spaced apart, in order to facilitate bonding between the coil part 70 and the flexible circuit board to be electrically connected with the control circuit, as shown in FIG. 12, the near field communication antenna further includes a first extraction electrode 703 and a second extraction electrode 704 which are electrically connected to the first end and the second end of the coil part 70, respectively; and the first extraction electrode 703 and the second extraction electrode 704 are both located in the peripheral region Q2. FIG. 16 is a schematic diagram of a first extraction electrode 703 (a second extraction electrode 704) in a display substrate according to an embodiment of the present disclosure. As shown in FIG. 16, the first extraction electrode 703 and the second extraction electrode 704 may each include a first extraction part 7031 and a second extraction part 7032 which are sequentially arranged in a direction away from the base substrate and electrically connected. In some examples, the first extraction part 7031 is disposed in the same layer as the first conductive structures 700, and the second extraction part 7032 is disposed in the same layer as the second conductive structures. In this case, the first extraction part 7031 and the second extraction part 7032 of the first extraction electrode 703 (the second extraction electrode 704) are electrically connected through a via penetrating through the interlayer insulation layer 50. In this case, the second extraction part of the first extraction electrode 703 is electrically connected to the second conductive line 702 of one first sub-structure 71; and the second extraction part of the second extraction electrode 704 is electrically connected to the second conductive line 702 of another first sub-structure 71. In the embodiment of the present disclosure, by using the first extraction part 7031 and the second extraction part 7032 being electrically connected as the first extraction electrode 703 (the second extraction electrode 704), a reduced resistance can be achieved.

Figure 17:
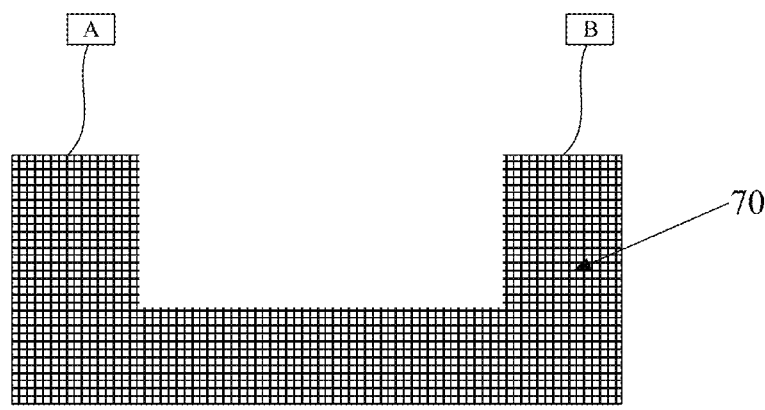
FIG. 17 is a schematic diagram showing connection between the near field communication antenna of FIG. 12 and connection pads.

It should be noted that, in the embodiment of the present disclosure, the first extraction electrode 703 and second extraction electrode 704 each has a width greater than the first sub-structure 71, and with such configuration, the resistance can be effectively reduced. Taking FIG. 3 as an example, the first region Q11 is located on a side of the second region Q12 close to the second pad region Q22, and a first connection pad A and a second connection pad B are provided in the second pad region Q22. In this case, the second extraction part 7032 of the first extraction electrode 703 may be electrically connected to the first connection pad A through a first extraction line; the second extraction part 7032 of the second extraction electrode 704 may be electrically connected to the second connection pad B through a second extraction line; and then, the flexible circuit board is bonded to the first connection pad A and the second connection pad B to realize connection between the coil part 70 of the near field communication antenna and the control circuit, as shown in FIG. 17. The first extraction line and the second extraction line may be disposed in the same layer and made of the same material as the second conductive structures 800. In this manner, the electrical connection between the first extraction line and the second extraction part 7032 of the first extraction electrode 703, as well as the electrical connection between the second extraction line and the second extraction part 7032 of the second extraction electrode 704, are facilitated. Similarly, the first region Q11 may be located on a side of the second region Q12 close to the first pad region Q21. That is, the near field communication antenna is disposed on a side of the display region Q1 close to the first pad region Q21. Alternatively, it is also possible that first regions Q11 are disposed on both a side of the second region Q12 close to the first pad region Q21 and a side of the second region Q12 close to the second pad region Q22. In this case, two near field communication antennas are disposed in the display region Q1. Regardless of one or two or more near field communication antennas being provided, the first end and the second end of the coil part 70 of each near field communication antenna may adopt the above-described structure.

Figure 18:
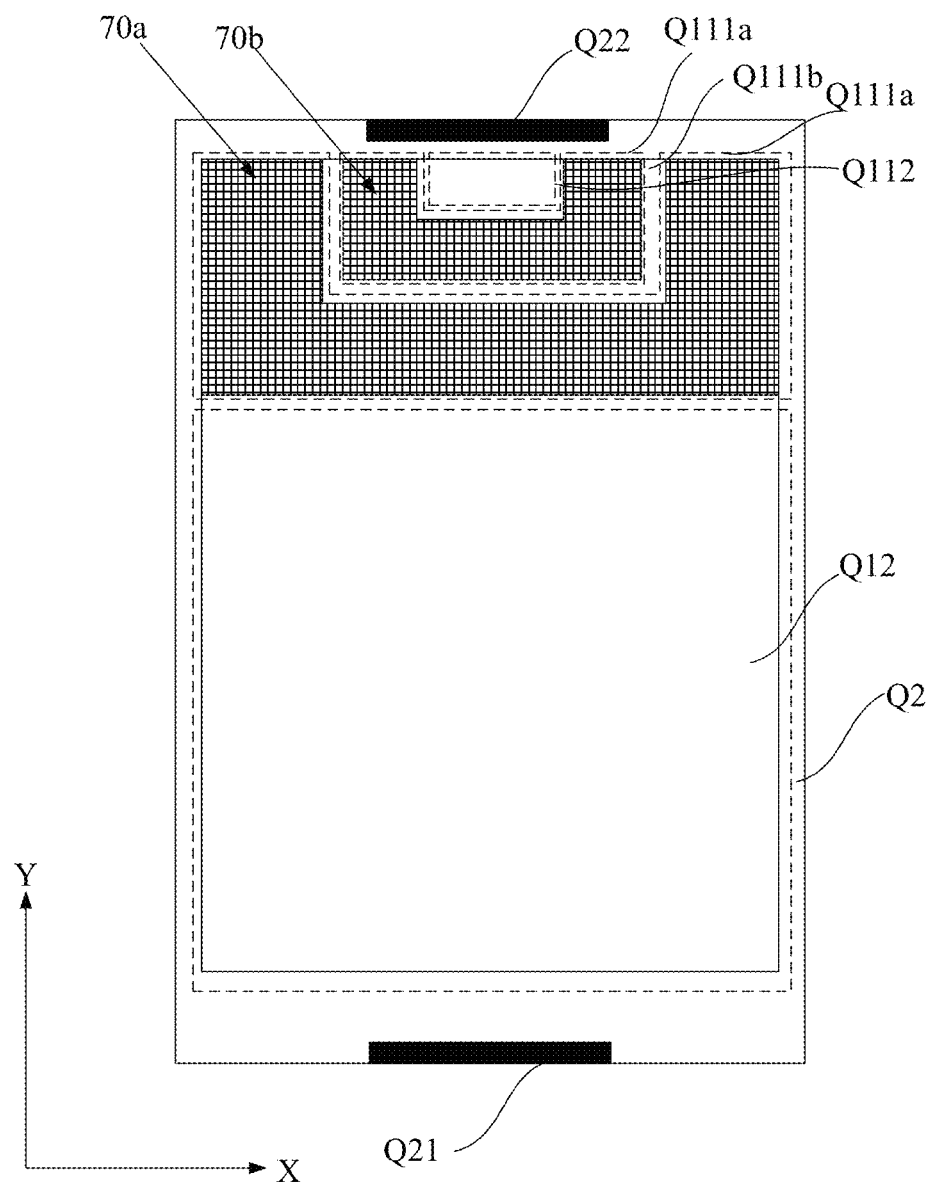
FIG. 18 is a schematic diagram of a display substrate according to an embodiment of the present disclosure.
Figure 19:
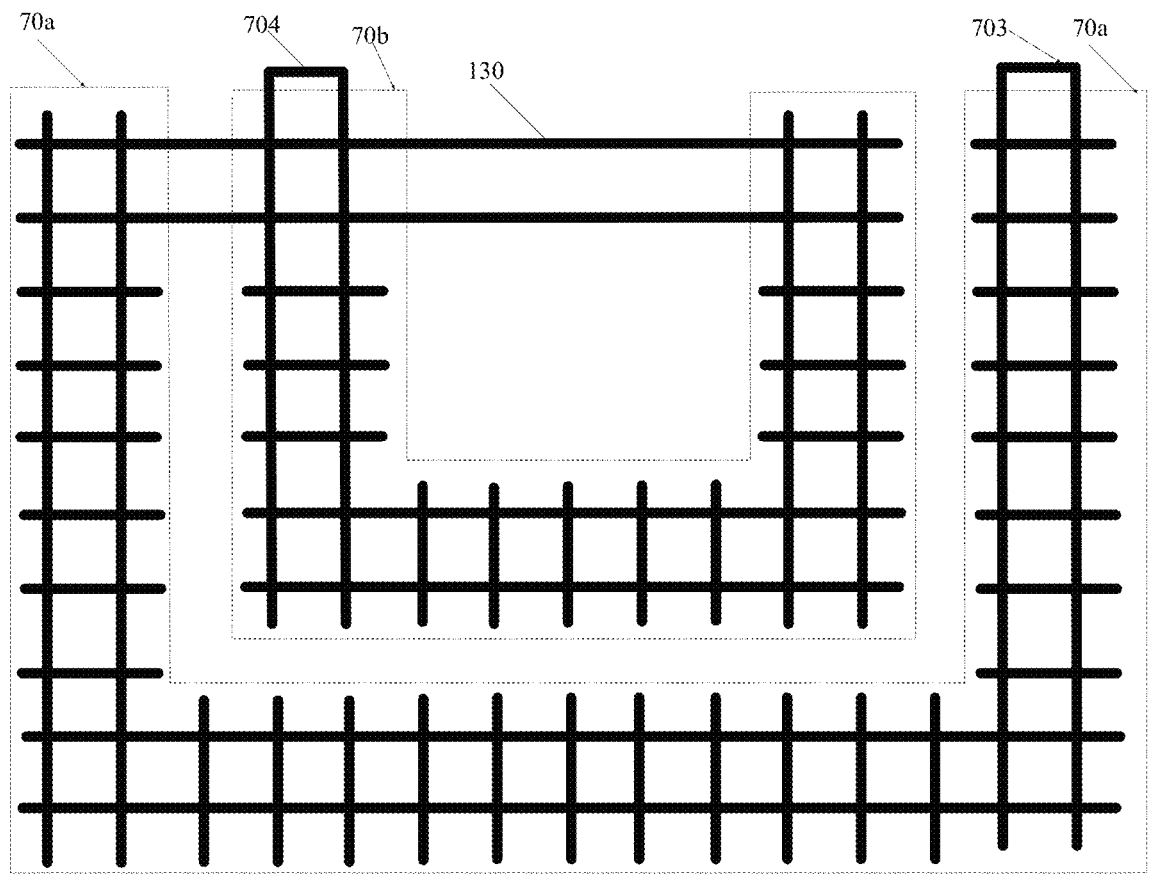
FIG. 19 is a schematic diagram of a near field communication antenna in the display substrate shown in FIG. 18.
Figure 20:
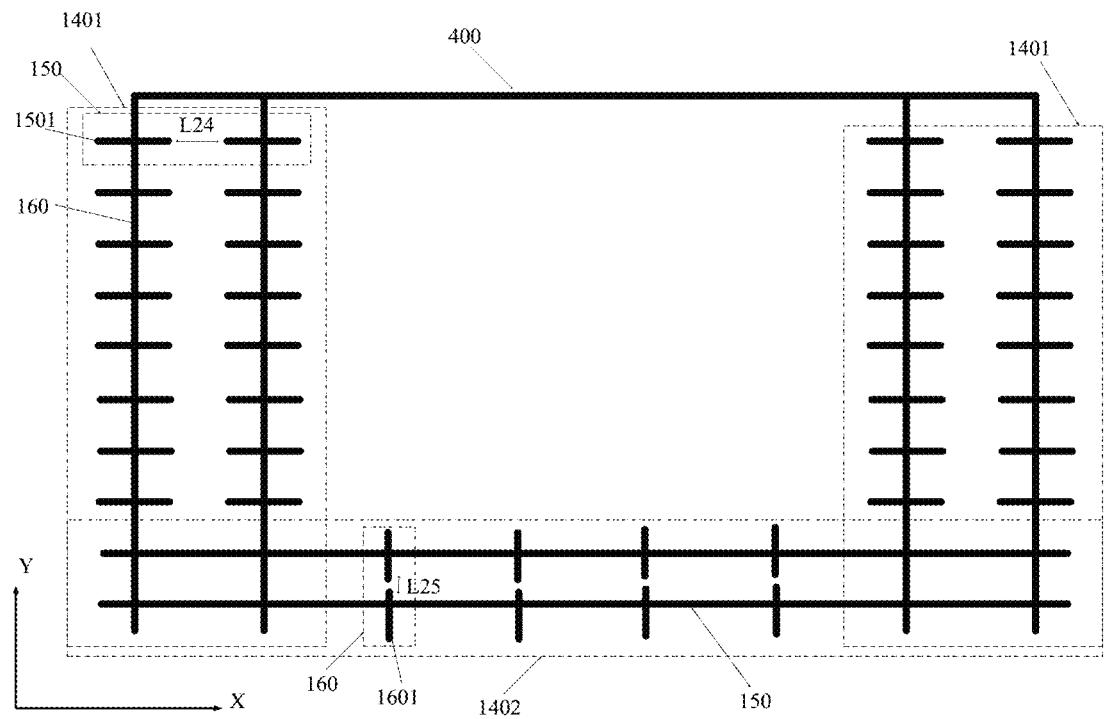
FIG. 20 is a schematic wiring diagram in a redundant functional region of the display substrate shown in FIG. 18.

The above describes the case where the near field communication antenna includes only one coil part 70, but in some examples, there may be a plurality of coil parts 70 arranged in a nested manner in the near field communication antenna. FIG. 18 is a schematic diagram of a display substrate according to an embodiment of the present disclosure; FIG. 19 is a schematic diagram of a near field communication antenna in the display substrate shown in FIG. 18; and FIG. 20 is a schematic wiring diagram in a redundant functional region Q111b of the display substrate shown in FIG. 18. As shown in FIGS. 18 to 20, for convenience of description, the functional region Q111 in the first region Q11 is divided into first functional sub-regions Q111a and a redundant functional region Q111b. Each first functional sub-region Q111a is provided with one coil part 70 of the near field communication antenna, and a region between two adjacent first functional sub-regions Q111a forms the redundant functional region Q111b. The coil part 70 in the first functional sub-region Q111a has the same structure as that described above, that is, includes the first conductive lines 701 and the second conductive lines 702, with the first conductive lines 701 intersecting with the second conductive lines 702. In the embodiment of the present disclosure, a plurality of seventh conductive lines 150 and a plurality of eighth conductive lines 160 are disposed in the redundant functional region Q111b, with the seventh conductive lines 150 intersecting with the eighth conductive lines 160. Each seventh conductive line 150 is a partial structure of one of the first conductive structures 700, and each eighth conductive line 160 is a partial structure of one of the second conductive structure 800. With such arrangement, the wiring uniformity on the display substrate is guaranteed so that the display substrate has a uniform aperture ratio.

Further, the first conductive line 701 and the seventh conductive line 150 in a same first conductive structure 700 should be disconnected, and a minimum distance between the first conductive line 701 and the seventh conductive line 150 closest thereto in a same first conductive structure 700 should satisfies that no coupling is generated between signals on the first conductive line 701 and the seventh conductive line 150. Similarly, the second conductive line 702 and the eighth conductive line 160 in a same second conductive structure 800 should be disconnected, and a minimum distance between the second conductive line 702 and the eighth conductive line 160 closest thereto in a same second conductive structure 800 should satisfies that no coupling is generated between signals on the second conductive line 702 and the eighth conductive line 160. In some examples, a distance between the first conductive line 701 and the seventh conductive line 150 closest thereto in a same first conductive structure 700 ranges from 2 μm to 6 μm: for example, the distance is about 4 μm. A distance between the eighth conductive line 160 and the second conductive line 702 closest thereto in a same second conductive structure 800 ranges from 2 μm to 6 μm: for example, the distance is about 4 μm.

In some examples, when the coil part 70 has a U-shaped structure, each first functional sub-region Q111*a* has a shape adapted to the shape of the coil part 70. Therefore, the first functional sub-region Q111*a* also has a U shape. The redundant functional region Q111*b* is located between two adjacent first functional sub-regions Q111*a*. Therefore, the redundant functional region Q111*b* is defined by adjacent first functional sub-regions Q111*a*, and thus also has a U shape. Meanwhile, the redundant coil part has a U-shaped structure. Specifically, the redundant coil part includes two first redundant sub-structures 1401 which are arranged side by side in the first direction X and each extend in the second direction Y, and a second redundant sub-structure 1402 extending in the first direction X and connected between the two first redundant sub-structures 1401. The first redundant sub-structures 1401 and the second redundant sub-structure 1402 each include the seventh conductive line 150 and the eighth conductive line 160. The eighth conductive line 160 in each first redundant sub-structure 1401 extends to a region where the second redundant sub-structure 1402 is located, and the seventh conductive line 150 in the second redundant sub-structure 1402 extends to a region where the first redundant sub-structure 1401 is located. Therefore, the electrical connection between the eighth conductive lines 160 in the two first redundant sub-structures 1401 and the seventh conductive line 150 in the second redundant sub-structure 1402 is achieved, and thus the electrical connection between the two first redundant sub-structures 1401 and the second redundant sub-structure 1402 is achieved. Further, in order to avoid signal coupling between the coil part 70 and the redundant coil part as much as possible, in some implementations, a broken design is applied to the seventh conductive line 150 in the first redundant sub-structure 1401 and the eighth conductive line 160 in the second redundant sub-structure 1402, so as to prevent the first conductive line 701 and the seventh conductive line 150 on the same first conductive structure 700 from being coupled to affect normal operation of the display substrate, and prevent the second conductive line 702 and the eighth conductive line 160 on the same second conductive structure 800 from being coupled to affect normal operation of the display substrate.

Specifically, in the embodiment of the present disclosure, each seventh conductive line 150 in the first redundant sub-structure 1401 includes a plurality of second conductive sub-lines 1501 arranged side by side in the first direction X; and a gap between adjacent second conductive sub-lines 1501 is located between adjacent sub-pixels. Similarly, each eighth conductive line 160 in the second redundant sub-structure 1402 includes a plurality of third conductive sub-lines 1601 arranged side by side in the second direction Y; and a gap between adjacent third conductive sub-lines 1601 is located between adjacent sub-pixels.

In some examples, in the above case, for any of the seventh conductive lines 150 in the first redundant sub-structures 1401, the gap between adjacent second conductive sub-lines 1501 has a width L24 ranging from 2 μm to 6 μm: for example, L24 is about 4 μm. For any of the eighth conductive lines 160 in the second redundant sub-structure 1402, the gap between adjacent third conductive sub-lines 1601 has a width L25 ranging from 2 μm to 6 μm: for example, L25 is about 4 μm. By reasonably setting the gap between the second conductive sub-lines 1501 on each seventh conductive line 150 of the first redundant sub-structures 1401, and the gap between the third conductive sub-lines 1601 on each eighth conductive line 160 of the second redundant sub-structure 1402, coupling between adjacent coil parts 70 in the near field communication antenna can be affectively avoided.

In some examples, when the peripheral region Q2 of the display substrate is provided with the common electrode line 400 as described above, the eighth conductive lines 160 of the first redundant sub-structure 1401 and the seventh conductive lines 150 of the second redundant sub-structure 1402 are both electrically connected to the common electrode line 400. For example, the common electrode line 400 includes the first common electrode sub-line and the second common electrode sub-line as described above. In this case, each eighth conductive line 160 of the first redundant sub-structures 1401 is electrically connected to the first common electrode sub-line through a via penetrating through the interlayer insulation layer 50, and each seventh conductive line 150 of the second redundant sub-structure 1402 is electrically connected to the second common electrode sub-line through a via penetrating through the interlayer insulation layer 50, so that voltages on the seventh conductive lines 150 and the eighth conductive lines 160 in the redundant coil part share a common voltage, thereby preventing the seventh conductive lines 150 and the eighth conductive lines 160 from entering a floating state. Certainly, since the eighth conductive lines 160 of the first redundant sub-structures 1401 intersect with the seventh conductive lines 150 of the second redundant sub-structure 1402, and are electrically connected with the seventh conductive lines 150 of the second redundant sub-structure 1402 through vias penetrating through the interlayer insulation layer 50, it is also possible that only each eighth conductive line 160 of the two first redundant sub-structures 1401 is electrically connected to the first common electrode sub-line through a via penetrating through the interlayer insulation layer 50: or only each seventh conductive line 150 of the second redundant sub-structure 1402 is electrically connected to the second common electrode sub-line through a via penetrating through the interlayer insulation layer 50. Either of such two methods can achieve that voltages on the seventh conductive lines 150 and the eighth conductive lines 160 in the redundant coil part share a common voltage.

In some examples, when a plurality of coil parts 70 are provided in the near field communication antenna, then the near field communication antenna further includes a connection jumper 130 on the base substrate 10. The connection jumper 130 is connected to the coil parts 70 to form a spiral coil.

In order to further clarify the connection relationship between the coil part 70 and the connection jumper 130 in the near field communication antenna, an explanation is given in the embodiment of the present disclosure by taking the near field communication antenna including two coil parts 70, called a first coil part 70*a* and a second coil part 70*b*, respectively, as an example. As shown in FIG. 19, the second coil part 70*b* is embedded in the first coil part 70*a*, the first coil part 70*a* and the second coil part 70*b* each include a first end and a second end, and two ends of the connection jumper 130 are connected to the first end of the first coil part 70*a* and the second end of the second coil part 70*b*, respectively. The second end of the first coil part 70*a* serves as the first end of the near field communication antenna, and the first end of the second coil part 70*b* serves as the second end of the near field communication antenna. In this case, in order to facilitate bonding between the near field communication antenna and the flexible circuit board to be electrically connected to the control circuit, the near field communication antenna further includes a first extraction electrode 703 and a second extraction electrode 704 which are electrically connected to the second end of the first coil part 70a and the first end of the second coil part 70b, respectively. The first extraction electrode 703 and the second extraction electrode 704 may each include a first extraction part 7031 and a second extraction part 7032 which are sequentially arranged in a direction away from the base substrate and electrically connected. In some examples, the first extraction part 7031 is disposed in the same layer as the first conductive structures 700, and the second extraction part 7032 is disposed in the same layer as the second conductive structures. In this case, the first extraction part 7031 and the second extraction part 7032 of the first extraction electrode 703 (the second extraction electrode 704) are electrically connected through a via penetrating through the interlayer insulation layer. In this case, the second extraction part of the first extraction electrode 703 is electrically connected to the second conductive line 702 of one first sub-structure 71; and the second extraction part of the second extraction electrode 704 is electrically connected to the second conductive line 702 of another first sub-structure 71. In the embodiment of the present disclosure, by using the first extraction part 7031 and the second extraction part 7032 being electrically connected as the first extraction electrode 703 (the second extraction electrode 704), a reduced resistance can be achieved.

It should be noted that, taking FIG. 18 as an example, the first region Q11 is located on a side of the second region Q12 close to the second pad region Q22, and a first connection pad A and a second connection pad B are provided in the second pad region Q22. In this case, the second extraction part 7032 of the first extraction electrode 703 may be electrically connected to the first connection pad A through the first extraction line; the second extraction part 7032 of the second extraction electrode 704 may be electrically connected to the second connection pad B through the second extraction line; and then, the flexible circuit board is bonded to the first connection pad A and the second connection pad B to realize connection between the coil part 70 of the near field communication antenna and the control circuit. The first extraction line and the second extraction line may be disposed in the same layer and made of the same material as the second conductive structures 800. In this manner, the electrical connection between the first extraction line and the second extraction part 7032 of the first extraction electrode 703, as well as the electrical connection between the second extraction line and the second extraction part 7032 of the second extraction electrode 704, are facilitated. Similarly, the first region Q11 may be located on a side of the second region Q12 close to the first pad region Q21. That is, the near field communication antenna is disposed on a side of the display region Q1 close to the first pad region Q21. Alternatively, it is also possible that first regions Q11 are disposed on both a side of the second region Q12 close to the first pad region Q21 and a side of the second region Q12 close to the second pad region Q22. In this case, two near field communication antennas are disposed in the display region Q1. Regardless of one or two or more near field communication antennas being provided, the first end and the second end of the coil part 70 of each near field communication antenna may adopt the above-described structure.

Further, the connection jumper 130 in the near field communication antenna may be disposed in the peripheral region Q2, and may be disposed in the same layer and made of the same material as the first conductive structures 700. In this case, the second conductive lines 702 at a first end of the first coil part 70a may be electrically connected to the connection jumper 130 through a via penetrating through the interlayer insulation layer 50, and the second conductive lines 702 at a second end of the second coil part 70b may be electrically connected to the connection jumper 130 through a via penetrating through the interlayer insulation layer 50. In some examples, the connection jumper 130 may be a partial structure of one of the first conductive structures 700. In this case, the connection jumper 130 extends in the first direction X. Certainly, in the embodiment of the present disclosure, the connection jumper 130 may be disposed in the peripheral region Q2.

Figure 21:
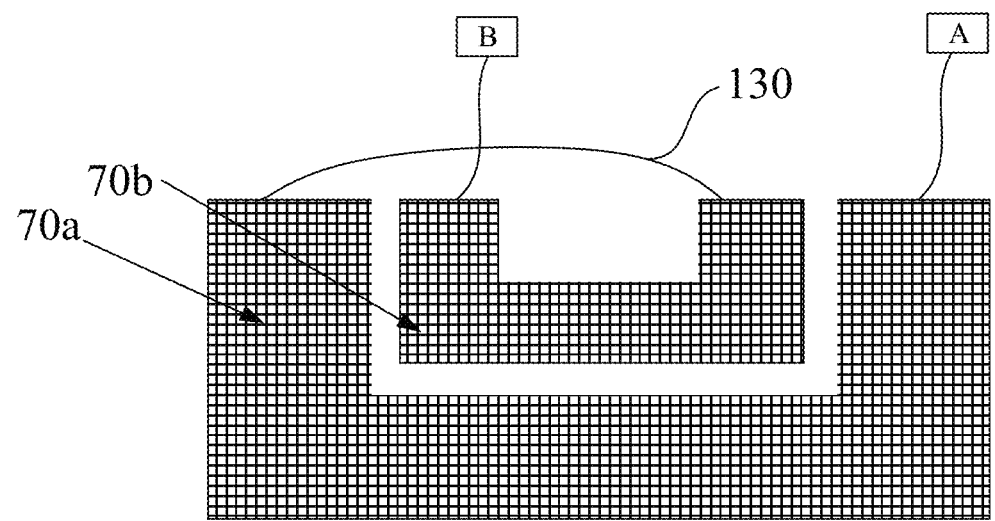
FIG. 21 is a schematic diagram showing connection between the field communication antenna of FIG. 19 and connection pads.

In some examples, the display substrate may further include a flexible circuit board, and when a plurality of coil parts 70 are provided in the near field communication antenna, the connection jumper 130 in the near field communication antenna may be formed on the flexible circuit board. Here, the coil parts 70 in the near field communication antenna may adopt the same structure as described above. In this case, as shown in FIG. 21, the second end of the first coil part 70a is connected to the first extraction electrode 703, and the second extraction part 7032 of the first extraction electrode 703 may be electrically connected to the first connection pad A through the first extraction line; the first end of the second coil part 70b is connected to the second extraction electrode 704, and the second extraction part 7032 of the second extraction electrode 704 may be electrically connected to the second connection pad B through the second extraction line; and the connection jumper 130 is bonded to the first connection pad A and the second connection pad B on the display substrate through connection pads on the flexible circuit board. In this manner, a spiral coil of the near field communication antenna is formed.

In order to further clarify the specific structure of the display substrate according to the embodiments of the present disclosure, three structural examples of the display substrate are specifically give below, but it should be noted that the three examples do not form any limitation to the scope of the embodiments of the present disclosure.

As a first example, as shown in FIG. 3, the display region Q1 in the display substrate includes a first region Q11 and a second region Q12. The first region Q11 is located on a side of the second region Q12 close to the second pad region Q22. A near field communication antenna having one coil part 70 is disposed in the first region Q11. The first region Q11 includes a non-functional region Q112 and a functional region Q111 surrounding the non-functional region Q112. The coil part 70 is disposed in the functional region Q111. The specific structure of the coil part 70 is as described above, and thus will not be repeated here. The fifth conductive lines 80 and the sixth conductive lines 90 as described above are disposed in the non-functional region Q112, with the fifth conductive lines 80 intersecting with the sixth conductive lines 90; and the third conductive lines 110 and the fourth conductive lines 120 as described above are disposed in the second region Q12, with the third conductive lines 110 intersecting with the fourth conductive lines 120. The third conductive lines 110, the fourth conductive lines 120, the fifth conductive lines 80, and the sixth conductive lines 90 have been described in detail above, and thus are not repeated here.

As a second example, as shown in FIG. 18, the display region Q1 in the display substrate includes a first region Q11 and a second region Q12. The first region Q11 is located on a side of the second region Q12 close to the second pad region Q22. A near field communication antenna having two coil parts 70 is disposed in the first region Q11. The two coil parts 70 are referred to as a first coil part 70a and a second coil part 70b, respectively. The first region Q11 includes a non-functional region Q112 and a functional region Q111 surrounding the non-functional region Q112. The functional region Q111 includes two first functional sub-regions Q111a, and a redundant functional region Q111b between the two first functional sub-regions Q111a. The first coil part 70a and the second coil part 70b are disposed in the two first functional sub-regions Q111a, respectively. The specific structures of the first coil part 70a and the second coil part 70b are as described above, and thus are not repeated here. The seventh conductive lines 150 and the eighth conductive lines 160 as described above are disposed in the redundant functional region Q111b: the fifth conductive lines 80 and the sixth conductive lines 90 as described above are disposed the non-functional region Q112, with the fifth conductive lines 80 intersecting with the sixth conductive lines 90; and the third conductive lines 110 and the fourth conductive lines 120 as described above are disposed in the second region Q12, with the third conductive lines 110 intersecting with the fourth conductive lines 120. The third conductive lines 110, the fourth conductive lines 120, the fifth conductive lines 80, the sixth conductive lines 90, the seventh conductive lines 150, and the eighth conductive lines 160 have been described in detail above, and thus are not repeated here.

Figure 22:
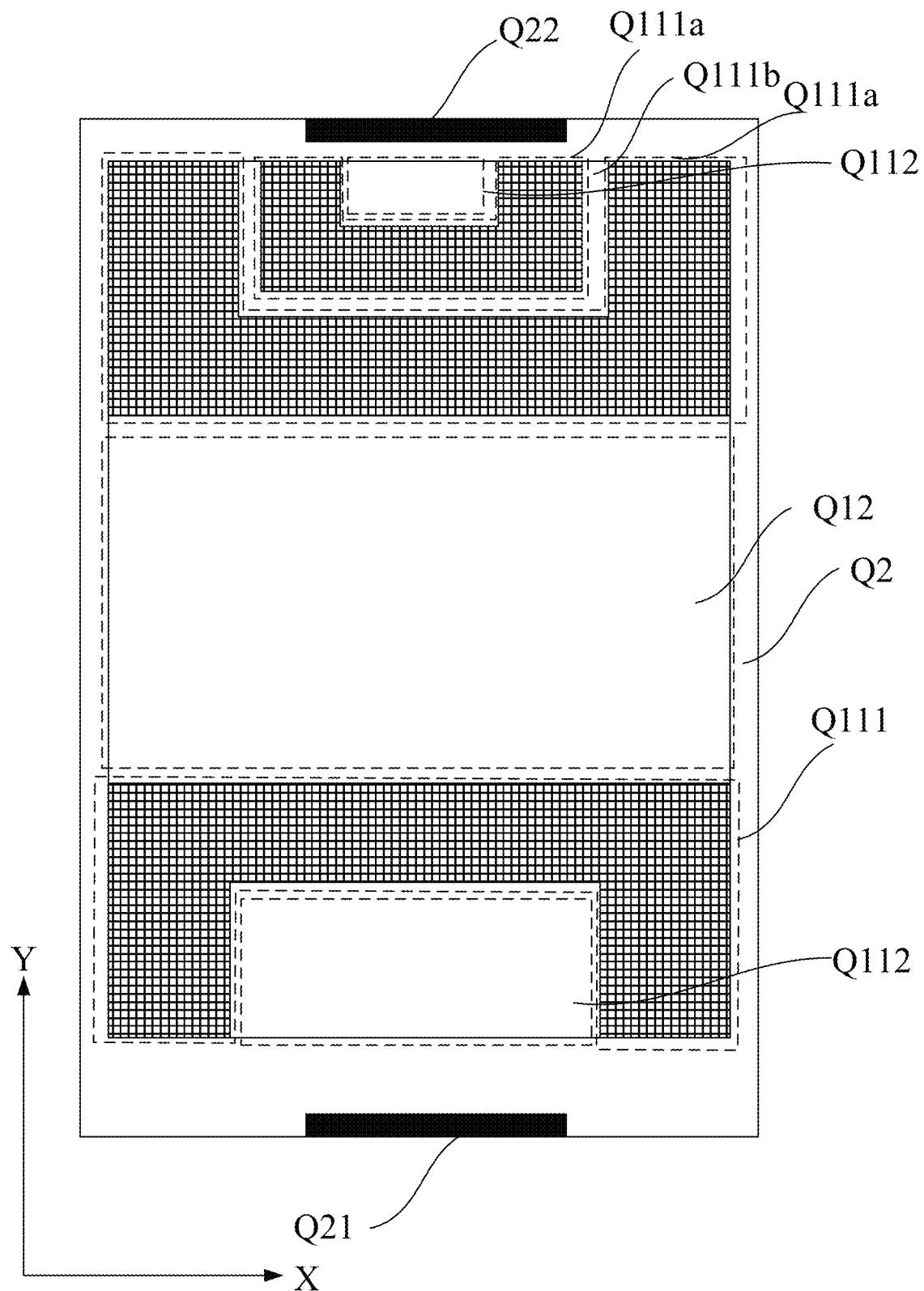
FIG. 22 is a schematic diagram of a display substrate according to an embodiment of the present disclosure

In a third example, FIG. 22 is a schematic diagram of a display substrate according to an embodiment of the present disclosure. As shown in FIG. 22, the display region Q1 in the display substrate includes two first regions Q11 and a second region Q12. One of the two first regions Q11 is located on a side of the second region Q12 close to the first pad region Q21, and the other of the two first regions Q11 is located on a side of the second region Q12 close to the second pad region Q22. One of the two first regions Q11 is provided with the same structure as that shown in FIG. 3, i.e., provided with the near field communication antenna having two coil parts 70, which will not described in detail here. The other of the two first regions Q11 is provided with the same structure as that shown in FIG. 18, i.e., provided with the near field communication antenna having one coil part 70, which will not described in detail here. The third conductive lines 110 and the fourth conductive lines 120 as described above are disposed in the second region Q12, with the third conductive lines 110 intersecting with the fourth conductive lines 120. The third conductive lines 110, and the fourth conductive lines 120 have been described in detail above, and thus are not repeated here.

In a second aspect, an embodiment of the present disclosure further provides a display apparatus, including the above display substrate, and an opposite substrate, the display substrate and the opposite substrate are oppositely arranged, and aligned and assembled into a cell. The opposite substrate is provided with a black matrix, and orthographic projections of the gate lines GL, the data lines DL, the first conductive structures 700 and the second conductive structures 800 on the base substrate 10 are all located within an orthographic projection of the black matrix on the base substrate. Certainly, the display apparatus may further include a control circuit connected to the near field communication antenna.

The display apparatus may be a liquid crystal display panel, an OLED panel, a mobile phone, a tablet, a digital album, a navigator or any other product or device having a display function and a communication function.

It will be appreciated that the above implementations are merely exemplary implementations for the purpose of illustrating the principle of the present disclosure, and the present disclosure is not limited thereto. It will be apparent to those skilled in the art that various modifications and variations may be made to the exemplary implementations without departing from the spirit or essence of the present disclosure. Such modifications and variations should also be considered as falling into the protection scope of the present disclosure.

What is claimed is:

1. A display substrate, having a display region, and a peripheral region surrounding the display region; wherein the display substrate comprises:
   a base substrate;
   a plurality of first conductive structures on the base substrate in the display region and the peripheral region; wherein the plurality of first conductive structures each extend in a first direction and are arranged side by side in a second direction;
   an interlayer insulation layer on a side of the first conductive structures away from the base substrate;
   a plurality of second conductive structures on a side of the interlayer insulation layer away from the base substrate and in the display region and the peripheral region; wherein the plurality of second conductive structures each extend in the second direction and are arranged side by side in the first direction; and the second conductive structures intersect with the first conductive structures, and are electrically connected with the first conductive structures through vias penetrating through the interlayer insulation layer; and
   at least one third conductive structure on the base substrate in at least the display region; wherein
   the third conductive structure comprises a plurality of first conductive lines and a plurality of second conductive lines; each first conductive line forms at least a partial structure of one of the first conductive structures, and part of the first conductive structures each comprise two first conductive lines; and each second conductive line forms at least a partial structure of one of the second conductive structures,
   the display substrate further comprises:
   a plurality of gate lines on the base substrate in the display region and the peripheral region; wherein the plurality of gate lines each extend in the first direction and are arranged side by side in the second direction; and
   a plurality of data lines on the base substrate in the display region and the peripheral region; wherein the plurality of gate lines each extend in the second direction and are arranged side by side in the first direction; and
   a plurality of sub-pixels on the base substrate in the display region; wherein the sub-pixels are disposed in regions defined by the gate lines and data lines, with the gate lines intersecting with the data lines; the sub-pixels arranged side by side in the first direction form first pixel groups; the sub-pixels arranged side by side in the second direction form second pixel groups; and any adjacent first pixel groups are provided with one of the first conductive structures therebetween,
   wherein at least part pairs of adjacent second pixel groups each are provided with one of the second conductive structures between the adjacent second pixel group, wherein the third conductive structure comprises at least one coil part; the coil part comprises at least two sub-structures extending in different directions; and each of the sub-structures comprises the first conductive line and the second conductive line, and wherein the coil part comprises three sub-structures, comprising two first sub-structures and one second sub-structure; and the two first sub-structures each extend in the second direction, and are arranged side by side in the first direction, and the second sub-structure is connected between the two first sub-structures, wherein the display region comprises at least one first region and at least one second region; the third conductive structure is located in the first region; the first region comprises a non-functional region, and a functional region surrounding the non-functional region; the functional region comprises functional sub-regions arranged in a nested manner, and a redundant functional region between adjacent functional sub-regions; each functional sub-region is provided with one coil part;

the display substrate further comprises a redundant coil part on the base substrate; and each redundant functional region is provided with one redundant coil part; and the redundant coil part comprises a plurality of seventh conductive lines and a plurality of eighth conductive lines in the redundant functional region, with the seventh conductive lines intersecting with the eighth conductive lines; wherein each seventh conductive line is a partial structure of one of the first conductive structures, and each eighth conductive line is a partial structure of one of the second conductive structures, and wherein a distance between the first conductive line and the seventh conductive line closest thereto in a same one of the first conductive structures ranges from about 2 µm to about 6 µm; and/or a distance between the eighth conductive line and the second conductive line closest thereto in a same one of the second conductive structures ranges from about 2 µm to about 6 µm, wherein the redundant coil part comprises two first redundant sub-structures which are arranged side by side in the first direction and each extend in the second direction, and a second redundant sub-structure extending in the first direction and connected between the two first redundant sub-structures; the first redundant sub-structures and the second redundant sub-structure each comprise the seventh conductive line and the eighth conductive line; the eighth conductive line in each first redundant structure extends to a region where the second redundant structure is located, and the seventh conductive line in the second redundant structure extends to a region where each first redundant structure is located;

each seventh conductive line in the first redundant sub-structures comprises a plurality of second conductive sub-lines arranged side by side in the first direction; a gap between adjacent second conductive sub-lines is located between adjacent sub-pixels; and/or each eighth conductive line in the second redundant sub-structure comprises a plurality of third conductive sub-lines arranged side by side in the second direction; and a gap between adjacent third conductive sub-lines is located between adjacent sub-pixels, wherein the gap between adjacent second conductive sub-lines has a width ranging from about 2 µm to about 6 µm; and/or the gap between adjacent third conductive sub-lines has a width ranging from about 2 µm to about 6 µm, the display substrate further comprises:

a common electrode line on the base substrate in the peripheral region; wherein the common electrode line comprises a first common electrode sub-line extending in the first direction, and a second common electrode sub-line extending in the second direction; the first common electrode sub-line is disposed in a same layer and made of a same material as the first conductive structures; the second common electrode sub-line is disposed in a same layer and made of a same material as the second conductive structures; the first common electrode sub-line is electrically connected to the second common electrode sub-line through a via penetrating through the interlayer insulation layer;

each eighth conductive line of the first redundant sub-structures is electrically connected to the first common electrode sub-line through a via penetrating through the interlayer insulation layer; and/or each seventh conductive line of the second redundant sub-structure is electrically connected to the second common electrode sub-line through a via penetrating through the interlayer insulation layer.

2. The display substrate according to claim 1, wherein the sub-pixels in a same one of the second pixel groups have a same color, and every N sub-pixels arranged side by side in the first direction form a pixel unit, where N≥2; and N is an integer; the pixel units arranged side by side in the second direction form a pixel unit group; and each pixel unit group is provided with at least one second conductive structure, wherein the N sub-pixels in the pixel unit comprise a red sub-pixel, a green sub-pixel, and a blue sub-pixel; the second conductive structure is located between the red sub-pixel and the green sub-pixel.

3. The display substrate according to claim 1, wherein the display region comprises at least one first region and at least one second region; each first region is provided with one third conductive structure; and the display substrate further comprises:

a plurality of third conductive lines and a plurality of fourth conductive lines on the base substrate in the second region and the peripheral region; wherein the plurality of third conductive lines intersect with the plurality of fourth conductive lines, and each third conductive line forms at least a partial structure of one of the first conductive structures, and each fourth conductive line is a partial structure of one of the second conductive structures; and a distance between the fourth conductive line and the second conductive line in a same one of the second conductive structures ranges from about 2 µm to about 6 µm, the display substrate further comprises:

a common electrode line on the base substrate in the peripheral region; wherein the common electrode line comprises a first common electrode sub-line extending in the first direction, and a second common electrode sub-line extending in the second direction; the first common electrode sub-line is disposed in the same layer and made of the same material as the first conductive structures; the second common electrode sub-line is disposed in a same layer and made of a same material as the second conductive structures; the first common electrode sub-line is electrically connected to the second common electrode sub-line through a via penetrating through the interlayer insulation layer;

each third conductive line is electrically connected to the second common electrode sub-line through a via penetrating through the interlayer insulation layer; and/or each fourth conductive line is electrically connected to the first common electrode sub-line through a via penetrating through the interlayer insulation layer.

4. The display substrate according to claim 1, wherein the display region comprises at least one first region and at least one second region; the third conductive structure is located in the first region; the first region comprises a non-functional region, and a functional region surrounding the non-functional region; the coil part is disposed in the functional region;

the display substrate further comprises: a plurality of fifth conductive lines and a plurality of sixth conductive lines in the non-functional region, with the fifth conductive lines intersecting with the sixth conductive lines; each first conductive structure comprises a fifth conductive line; each second conductive structure comprises a sixth conductive line; a distance between the fifth conductive line and the first conductive line in a same one of the first conductive structures ranges from about 2 μm to about 6 μm; and/or a distance between the sixth conductive line and the second conductive line in a same one of the second conductive structures ranges from 2 μm to 6 μm.

5. The display substrate according to claim 4, wherein each fifth conductive line comprises a plurality of first conductive sub-lines arranged side by side and at intervals in the first direction; a gap between adjacent first conductive sub-lines is located between adjacent sub-pixels, and wherein the gap between adjacent first conductive sub-lines has a width ranging from about 2 μm to about 6 μm.

6. The display substrate according to claim 5, further comprising:

a common electrode line on the base substrate in the peripheral region; wherein the common electrode line comprises a first common electrode sub-line extending in the first direction, and a second common electrode sub-line extending in the second direction; the first common electrode sub-line is disposed in a same layer and made of a same material as the first conductive structures; the second common electrode sub-line is disposed in a same layer and made of a same material as the second conductive structures; the first common electrode sub-line is electrically connected to the second common electrode sub-line through a via penetrating through the interlayer insulation layer; and each sixth conductive line is electrically connected to the first common electrode sub-line through a via penetrating through the interlayer insulation layer.

7. The display substrate according to claim 1, further comprising:

a connection jumper on the base substrate, wherein the connection jumper is connected to the coil part to form a spiral coil, or a flexible circuit board on which a connection jumper is disposed, and the connection jumper is connected to the coil part to form a spiral coil.

8. The display substrate according to claim 7, wherein two coil parts, comprising a first coil part and a second coil part, are provided, and the first coil part surrounds the second coil part; the first coil part and the second coil part each comprise a first end and a second end, and two ends of the connection jumper are connected to the first end of the first coil part and the second end of the second coil part, respectively, and wherein the second end of the first coil part is connected to a first extraction electrode; the first end of the second coil part is connected to a second extraction electrode; the first extraction electrode and/or the second extraction electrode each comprise a first extraction part and a second extraction part which are disposed on the base substrate and electrically connected through a via penetrating through the interlayer insulation layer; and the first extraction part is disposed in a same layer and made of a same material as the first sub-structures, and the second extraction part is disposed in a same layer and made of a same material as the second sub-structure.

9. The display substrate according to claim 1, further comprising:

a first conductive layer on the base substrate; wherein the first conductive layer comprises the first conductive structures and the gate lines; and a second conductive layer on a side of the interlayer insulation layer away from the base substrate; wherein the second conductive layer comprises the second conductive structures and the data lines.

10. The display substrate according to claim 1, wherein each first conductive structure comprises a first body part and a first connection part; the first body part extends in the first direction, and the first connection part is connected to the first body part; the second conductive structure comprises a second body part and a second connection part; the second body part extends in the second direction, and the second connection part is connected to the second body part; and the first connection part of each first conductive structure is connected to the second connection part of the second conductive structure which intersect with the first conductive structure through a via penetrating through the interlayer insulation layer.

11. The display substrate according to claim 10, wherein the first connection part is located on a side of the first body part connected thereto close to the gate line closest to the first body part; the second connection part is located on a side of the second body part connected thereto away from the data line closest to the second body part; and the first connection part and the second connection part each comprise a first side edge and a second side edge which are disposed oppositely in the first direction, and a third side edge and a fourth side edge which are disposed oppositely in the second direction; wherein the third side edge of the first connection part is connected to the first body part; the second side edge of the second connection part is connected to the second body part;

orthographic projections of the first side edge and the third side edge of the first connection part on the base substrate has a distance not less than about 2.0 μm to an orthographic projection of the via on the base substrate; and/or orthographic projections of the first side edge, the third side edge, and the fourth side edge of the second connection part on the base substrate has a distance not less than about 2.0 μm to the orthographic projection of the via on the base substrate.

12. The display substrate according to claim 10, wherein a distance between the first connection part and the gate line closest thereto is not less than about 4 μm, and/or a distance between the second body part and the data line closest thereto is not less than about 3.5 μm.

13. The display substrate according to claim 10, wherein each sub-pixel comprises at least a thin film transistor, a pixel electrode, and a common electrode; a gate of the thin film transistor is disposed in a same layer and made of a same material as the gate lines, and a source and a drain of the thin film transistor is disposed in a same layer and made of a same material as the data lines; the pixel electrode is connected to the drain of the thin film transistor, the common electrode is disposed on a side of the pixel electrode away from the base substrate, and a passivation layer is disposed between a layer where the common electrode is located and a layer where the pixel electrode is located; and a distance between the second connection part and the pixel electrode closest thereto is not less than about 2.0 µm.

14. The display substrate according to claim 1, wherein each sub-pixel comprises at least a thin film transistor, a pixel electrode, and a common electrode; a gate of the thin film transistor is disposed in a same layer and made of a same material as the gate lines, and a source and a drain of the thin film transistor is disposed in a same layer and made of a same material as the data lines; the pixel electrode is connected to the drain of the thin film transistor, the common electrode is disposed on a side of the pixel electrode away from the base substrate, and a passivation layer is disposed between a layer where the common electrode is located and a layer where the pixel electrode is located; and common electrodes in the sub-pixels are connected into one piece to form a common electrode layer; and the common electrode layer comprises a plurality of first openings which each extend in the second direction and are arranged side by side in the first direction; and an orthographic projection of each first opening on the base substrate partially overlaps an orthographic projection of one of the second conductive structures on the base substrate, wherein the common electrode is a slit electrode; and orthographic projections of the first conductive structures and the common electrode on the base substrate at least partially overlap, wherein the common electrode layer further comprises a plurality of second openings which each extend in the first direction and are arranged side by side in the second direction; and an orthographic projection of each second opening on the base substrate at least partially overlaps orthogonal projections of the thin film transistors arranged side by side in the first direction on the base substrate.

15. The display substrate according to claim 1, wherein the peripheral region comprises a first pad region and a second pad region on opposite sides of the display region along the second direction; and the third conductive structure is disposed on a side of the display region close to the first pad region and/or the second pad region, and/or the third conductive structure comprises a near field communication antenna.

16. A display apparatus, comprising the display substrate according to claim 1, further comprising: an opposite substrate on which a black matrix is provided, the opposite substrate and the display substrate are oppositely arranged, and aligned and assembled into a cell, and an orthographic projection of the third conductive structure on the base substrate is located within an orthogonal projection of the black matrix on the base substrate.

* * * * *